(12) United States Patent
Sakai et al.

(10) Patent No.: US 9,306,144 B2
(45) Date of Patent: Apr. 5, 2016

(54) THERMOELECTRIC GENERATOR AND PRODUCTION METHOD FOR THERMOELECTRIC GENERATOR

(71) Applicant: Panasonic Corporation, Osaka (JP)

(72) Inventors: Akihiro Sakai, Nara (JP); Tsutomu Kanno, Kyoto (JP); Kohei Takahashi, Osaka (JP); Hiromasa Tamaki, Osaka (JP); Hideo Kusada, Osaka (JP); Yuka Yamada, Nara (JP)

(73) Assignee: Panasonic Corporation, Osaka (JP)

( * ) Notice: Subject to any disclaimer, the term of this patent is extended or adjusted under 35 U.S.C. 154(b) by 23 days.

(21) Appl. No.: 14/554,581

(22) Filed: Nov. 26, 2014

(65) Prior Publication Data

US 2015/0083181 A1    Mar. 26, 2015

Related U.S. Application Data

(63) Continuation of application No. PCT/JP2014/001647, filed on Mar. 20, 2014.

(30) Foreign Application Priority Data

Mar. 28, 2013   (JP) .................. 2013-067771

(51) Int. Cl.
*H01L 35/30*    (2006.01)
*H01L 35/16*    (2006.01)
(Continued)

(52) U.S. Cl.
CPC .............. *H01L 35/30* (2013.01); *C01B 19/002* (2013.01); *H01L 35/16* (2013.01); *H01L 35/18* (2013.01); *H01L 35/32* (2013.01); *H02N 11/00* (2013.01)

(58) Field of Classification Search
CPC ......... H01L 35/16; H01L 35/18; H01L 35/30; H01L 35/32
See application file for complete search history.

(56) References Cited

U.S. PATENT DOCUMENTS 4,902,648 A  *  2/1990  Ohta ................. H01L 35/34
                                                    136/200
4,935,345 A  *  6/1990  Guilbeau ........... A61B 5/14865
                                                    435/14

(Continued)

FOREIGN PATENT DOCUMENTS

JP    2000-261047 A    9/2000
JP    2008-147625 A    6/2008

(Continued)

OTHER PUBLICATIONS

International Search Report for corresponding International Application No. PCT/JP2014/001647 dated Jun. 24, 2014.

(Continued)

*Primary Examiner* — Golam Mowla
(74) *Attorney, Agent, or Firm* — Renner, Otto, Boisselle & Sklar, LLP

(57) ABSTRACT

An exemplary thermoelectric generator disclosed herein includes: a first electrode and a second electrode opposing each other; and a stacked body having a first end face and a second end face. The stacked body is structured so that first layers made of a first material and second layers made of a second material are alternately stacked, the first material containing a metal and particles having a lower thermal conductivity than that of the metal, the particles being dispersed in the metal, and the second material having a higher Seebeck coefficient and a lower thermal conductivity than those of the first material. Planes of stacking between the first layers and the second layers are inclined with respect to a direction in which the first electrode and the second electrode oppose each other.

18 Claims, 17 Drawing Sheets

(51) Int. Cl.
   *H01L 35/32* (2006.01)
   *H02N 11/00* (2006.01)
   *H01L 35/18* (2006.01)
   *C01B 19/00* (2006.01)

(56) References Cited

U.S. PATENT DOCUMENTS

| | | | | |
|---|---|---|---|---|
| 5,415,699 | A * | 5/1995 | Harman | H01L 35/16 136/225 |
| 5,434,744 | A * | 7/1995 | Fritz | H01L 35/32 136/203 |
| 5,897,330 | A * | 4/1999 | Watanabe | H01L 35/32 438/109 |
| 6,060,656 | A * | 5/2000 | Dresselhaus | H01L 35/26 136/203 |
| 6,060,657 | A * | 5/2000 | Harman | H01L 35/16 136/203 |
| 6,452,206 | B1 * | 9/2002 | Harman | H01L 35/16 257/17 |
| 2002/0148235 | A1 * | 10/2002 | Bell | F02G 1/043 62/3.3 |
| 2005/0161072 | A1 * | 7/2005 | Esser | H01L 35/02 136/205 |
| 2007/0068566 | A1 * | 3/2007 | Asatani | H01L 35/32 136/230 |
| 2008/0087314 | A1 | 4/2008 | Xiao et al. | |
| 2008/0173343 | A1 | 7/2008 | Kanno et al. | |
| 2009/0133734 | A1 | 5/2009 | Takahashi | |
| 2010/0237387 | A1 * | 9/2010 | Sato | H01L 21/02381 257/190 |
| 2013/0068273 | A1 | 3/2013 | Kanno et al. | |
| 2014/0086781 | A1 | 3/2014 | Sakai et al. | |
| 2014/0102499 | A1 | 4/2014 | Takahashi et al. | |

FOREIGN PATENT DOCUMENTS

| | | |
|---|---|---|
| JP | 2009-141127 A | 6/2009 |
| JP | 2011-198778 A | 10/2011 |
| JP | 2013-016685 A | 1/2013 |
| JP | 2013-062275 A | 4/2013 |
| WO | WO 2006/004059 A1 | 1/2006 |
| WO | WO 2006/082926 A1 | 8/2006 |
| WO | WO 2008/056466 A1 | 5/2008 |
| WO | WO 2010/007729 A1 | 1/2010 |
| WO | WO 2012/014366 A1 | 2/2012 |
| WO | WO 2013/065856 A1 | 5/2013 |
| WO | WO 2013/150773 A1 | 10/2013 |
| WO | WO 2013/161174 A1 | 10/2013 |

OTHER PUBLICATIONS

T. Kanno et al., "A Tubular Electric Power Generator Using Off-Diagonal Thermoelectric Effects" (2011), preprints from the 72nd Symposium of the Japan Society of Applied Physics, 30a-F-14 , 09-062 and concise explanation.

A. Sakai et al., "Enhancement in performance of the tubular thermoelectric generator (TTEG)" (2012), International conference on thermoelectrics 2012.

Kanno et al., "Development of thermoelectric generation tube for utilising unutilized thermo energy", Jul. 24, 2014, Panasonic Corporation, Japan, pp. 100-108 and concise explanation.

T. Kanno et al., "A Tubular Thermoelectric Generator with Piled Conical Rings Structure", preprints on Aug. 29, 2011, Advanced Technology Research Laboratories, Panasonic Corporation, Kyoto, Japan.

Kanno et al., "Development of thermoelectric generation tube for utilising unutilized thermo energy", Jul. 24, 2012, Panasonic Corporation, Japan, pp. 100-108 and concise explanation (previously submitted on IDS filed on Nov. 26, 2015.

* cited by examiner

THERMOELECTRIC GENERATOR AND PRODUCTION METHOD FOR THERMOELECTRIC GENERATOR

This is a continuation of International Application No. PCT/JP2014/001647, with an international filing date of Mar. 20, 2014, which claims priority of Japanese Patent Application No. 2013-067771, filed on Mar. 28, 2013, the contents of which are hereby incorporated by reference.

BACKGROUND

1. Technical Field

The present application relates to a thermoelectric generator which converts heat into electric power, and a production method for a thermoelectric generator.

2. Description of the Related Art

A thermoelectric conversion element is an element which can convert heat into electric power, or electric power into heat. A thermoelectric conversion element made of a thermoelectric material that shows the Seebeck effect is able to obtain thermal energy from a heat source at a relatively low temperature (e.g., 200° C. or less), and convert it into electric power. With a thermoelectric generation technique based on such a thermoelectric conversion element, it is possible to collect and effectively utilize thermal energy which would conventionally have been dumped unused into the ambient in the form of steam, hot water, exhaust gas, or the like.

Hereinafter, a thermoelectric conversion element which is made of a thermoelectric material will be referred to as a "thermoelectric generator". A generic thermoelectric generator has a so-called "π structure" in which a p-type semiconductor and an n-type semiconductor of mutually different carrier electrical polarities are combined (for example, Japanese Laid-Open Patent Publication No. 2013-016685). In a "π structure" thermoelectric generator, a p-type semiconductor and an n-type semiconductor are connected electrically in series, and thermally in parallel. In a "π structure", the direction of temperature gradient and the direction of electric current flow are parallel or antiparallel to each other. This makes it necessary to provide output terminals on the high-temperature heat source side or the low-temperature heat source side. Therefore, complicated wiring structure will be required for a plurality of thermoelectric generators each having a "π structure" to be connected in electrical series.

International Publication No. 2008/056466 (hereinafter "Patent Document 2") discloses a thermoelectric generator which includes a stacked body sandwiched between a first electrode and a second electrode opposing each other, the stacked body including bismuth layers and metal layers of a different metal from bismuth being alternately stacked. In the thermoelectric generator disclosed in Patent Document 2, the planes of stacking are inclined with respect to the direction of a line connecting the first electrode and the second electrode. Moreover, tube-type thermoelectric generators are disclosed in International Publication No. 2012/014366 (hereinafter "Patent Document 3") and kanno et al., preprints from the $72^{nd}$ Symposium of the Japan Society of Applied Physics, 30a-F-14 "A Tubular Electric Power Generator Using Off-Diagonal Thermoelectric Effects" (2011) and A. Sakai et al., International conference on thermoelectrics 2012 "Enhancement in performance of the tubular thermoelectric generator (TTEG)" (2012). The entire disclosure of Patent Document 2 and Patent Document 3 is incorporated herein by reference.

SUMMARY

A thermoelectric generator as one implementation of the present disclosure comprises: a first electrode and a second electrode opposing each other; and a stacked body having a first principal face and a second principal face and a first end face and a second end face, the first end face and the second end face being located between the first principal face and the second principal face, and the first electrode and the second electrode being respectively electrically connected to the first end face and the second end face; the stacked body being structured so that first layers made of a first material and second layers made of a second material are alternately stacked, the first material containing a metal and particles having a lower thermal conductivity than that of the metal, the particles being dispersed in the metal, and the second material having a higher Seebeck coefficient and a lower thermal conductivity than those of the first material; planes of stacking between the first layers and the second layers being inclined with respect to a direction in which the first electrode and the second electrode oppose each other, wherein a potential difference occurs between the first electrode and the second electrode due to a temperature difference between the first principal face and the second principal face.

The thermoelectric generator according to the present disclosure provides an improved thermoelectric generation practicality.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
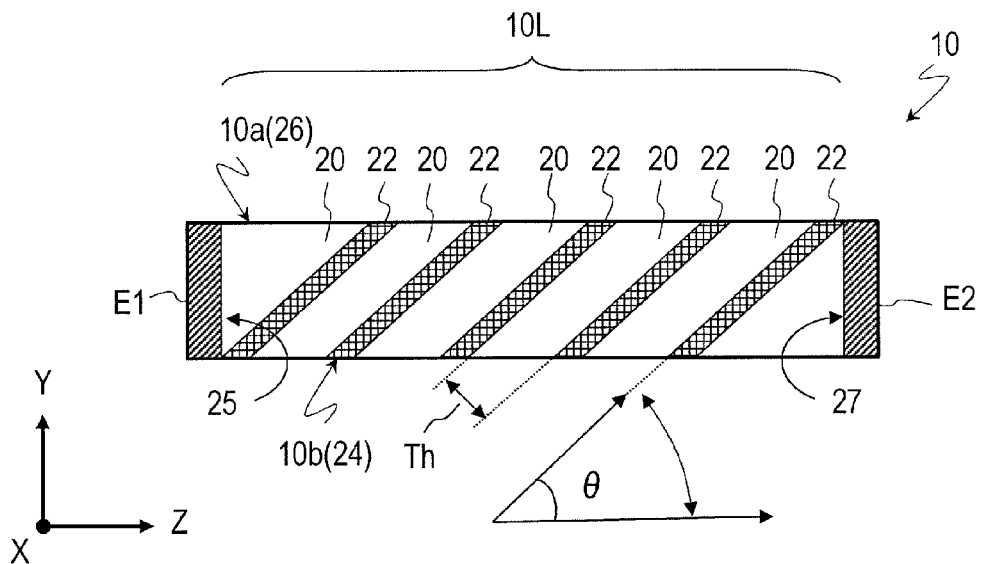
FIG. 1A is a cross-sectional view showing an embodiment of a thermoelectric generator according to the present disclosure.

There is a desire for a practical thermoelectric generator utilizing a thermoelectric generation technique.

As described above, Patent Document 2 discloses a thermoelectric generator having a stacked body that includes bismuth layers and metal layers of a different metal from bismuth, these layers being alternately stacked. As shown in FIG. 1 of Patent Document 2, a stacked body of e.g. a rectangular solid shape is located between a first electrode and a second electrode opposing each other. The stacked body has planes of stacking which are inclined with respect to the direction of a line connecting the first electrode and the second electrode. As shown in FIG. 2 of Patent Document 2, by placing a high-temperature heat source in contact with the upper face of the stacked body of the thermoelectric generator and a low-temperature heat source in contact with its lower face, a potential difference can be created between the first electrode and the second electrode. From a macroscopic point of view, the direction of temperature gradient introduced in the thermoelectric generator is orthogonal to the direction of an electric current which is generated in the thermoelectric generator.

Heat which is supplied from the high-temperature heat source flows to the low-temperature heat source via the thermoelectric generator. Generally speaking, the material composing the metal layers has a higher thermal conductivity than that of the material composing the thermoelectric material layers. Therefore, when a high-temperature heat source and a low-temperature heat source are placed in contact respectively with the upper face and the lower face of a thermoelectric generator as shown in FIG. 1 of Patent Document 2, heat which is supplied from the high-temperature heat source propagates primarily through the metal layers. This results in a lot of heat being dumped to the low-temperature heat source without being utilized for power generation. Therefore, reduction in thermal losses during power generation utilizing a thermoelectric generator is desired.

In view of these problems, the inventors have arrived at a novel thermoelectric generator and a production method for the thermoelectric generator. In summary, one implementation of the present disclosure is as follows.

A thermoelectric generator as one implementation of the present disclosure comprises: a first electrode and a second electrode opposing each other; and a stacked body having a first principal face and a second principal face and a first end face and a second end face, the first end face and the second end face being located between the first principal face and the second principal face, and the first electrode and the second electrode being respectively electrically connected to the first end face and the second end face; the stacked body being structured so that first layers made of a first material and second layers made of a second material are alternately stacked, the first material containing a metal and particles having a lower thermal conductivity than that of the metal, the particles being dispersed in the metal, and the second material having a higher Seebeck coefficient and a lower thermal conductivity than those of the first material; planes of stacking between the first layers and the second layers being inclined with respect to a direction in which the first electrode and the second electrode oppose each other, wherein a potential difference occurs between the first electrode and the second electrode due to a temperature difference between the first principal face and the second principal face.

The first principal face and the second principal face may be planes, and the stacked body may have a rectangular solid shape.

The stacked body may have a tubular shape, and the first principal face and the second principal face may be, respectively, an outer peripheral surface and an inner peripheral surface of the tube.

The first material may not contain Bi but contain a metal different from Bi; and the second material may contain Bi.

A content amount of the particles in the first material is not less than 0.1 wt % and not more than 10 wt %, for example.

A content amount of the particles in the first material may be not less than 1 wt % and not more than 5 wt %.

The particles are oxide particles, for example.

The particles may be particles of silicon dioxide.

The particles have a particle size of not less than 5 nm and not more than 100 nm, for example.

The metal includes one or more selected from the group consisting of nickel, cobalt, silver, gold, copper, chromium, and aluminum, for example.

The second material is $Bi_{0.5}Sb_{1.5}Te_3$, for example.

A thermoelectric generation tube as one implementation of the present disclosure comprises the above thermoelectric generator, the stacked body having a tubular shape.

A thermoelectric generation unit as one implementation of the present disclosure is a thermoelectric generation unit comprising a plurality of aforementioned thermoelectric generation tubes, each of the plurality of thermoelectric generation tubes having an outer peripheral surface and an inner peripheral surface, and a flow path defined by the inner peripheral surface, such that a temperature difference between the inner peripheral surface and the outer peripheral surface causes an electromotive force to be generated along an axial direction of the thermoelectric generation tube, and the thermoelectric generation unit further comprising: a container having the plurality of thermoelectric generation tubes accommodated in an interior thereof, the container having a fluid inlet and a fluid outlet for allowing a fluid to flow through the interior, the container having a plurality of openings in which the respective thermoelectric generation tubes are inserted; and a plurality of electrically conductive members electrically connecting the plurality of thermoelectric generation tubes.

A production method for a thermoelectric generator as one implementation of the present disclosure comprises: step (A) of providing: a plurality of first compacts having a pair of planes of stacking and a first side face and a second side face being located between the pair of planes of stacking and not perpendicular to the pair of planes of stacking, the plurality of first compacts being made of a source material for a first material which contains a metal and particles having a lower thermal conductivity than that of the metal, the particles being dispersed in the metal; and a plurality of second compacts having a pair of planes of stacking and a first side face and a second side face being located between the pair of planes of stacking and not perpendicular to the pair of planes of stacking, the plurality of second compacts being made of a source material for a second material having a higher Seebeck coefficient and a lower thermal conductivity than those of the first material; step (B) of forming a multilayer compact by alternately stacking the plurality of first compacts and the plurality of second compacts so that the respective planes of stacking are in contact with each other; and step (C) of sintering the multilayer compact.

Step (A) may further include a step of mixing the particles with the metal in particulate form.

<Embodiment of Thermoelectric Generator>

Hereinafter, an embodiment of the thermoelectric generator according to the present disclosure will be described in detail.

A non-limiting and exemplary implementation of the thermoelectric generator of the present disclosure includes: a first electrode and a second electrode opposing each other; and a stacked body having first and second principal faces and first and second end faces, the first end face and the second end face being located between the first principal face and the second principal face, and the first electrode and the second electrode being respectively electrically connected to the first end face and the second end face. A thermoelectric generator according to an embodiment of the present disclosure is constructed so that a potential difference occurs between the first electrode and the second electrode due to a temperature difference between the first principal face and the second principal face.

The stacked body in this thermoelectric generator has a structure in which first layers made of a first material and second layers made of a second material having a higher Seebeck coefficient and a lower thermal conductivity than those of the first material are alternately stacked. In the stacked body, planes of stacking between the first layers and the second layers are inclined with respect to a direction in which the first electrode and the second electrode oppose each other. The first material contains a metal and particles having a lower thermal conductivity than that of the metal and being dispersed in the metal. Since particles having a lower thermal conductivity than that of the metal composing the first material are dispersed in the metal, the thermal conductivity of the first material becomes lower than if the particles are not dispersed in the metal. The inventors have found that the thermoelectric generation characteristics of the thermoelectric generator are improved so long as a product of the thermal conductivity and the electrical resistivity of the first material does not change much. According to a non-limiting and exemplary implementation of the thermoelectric generator of the present disclosure, a temperature difference between the first principal face and the second principal face is effectively utilized, and thermal losses are suppressed.

<Construction of Thermoelectric Generator>

Figure 1B:
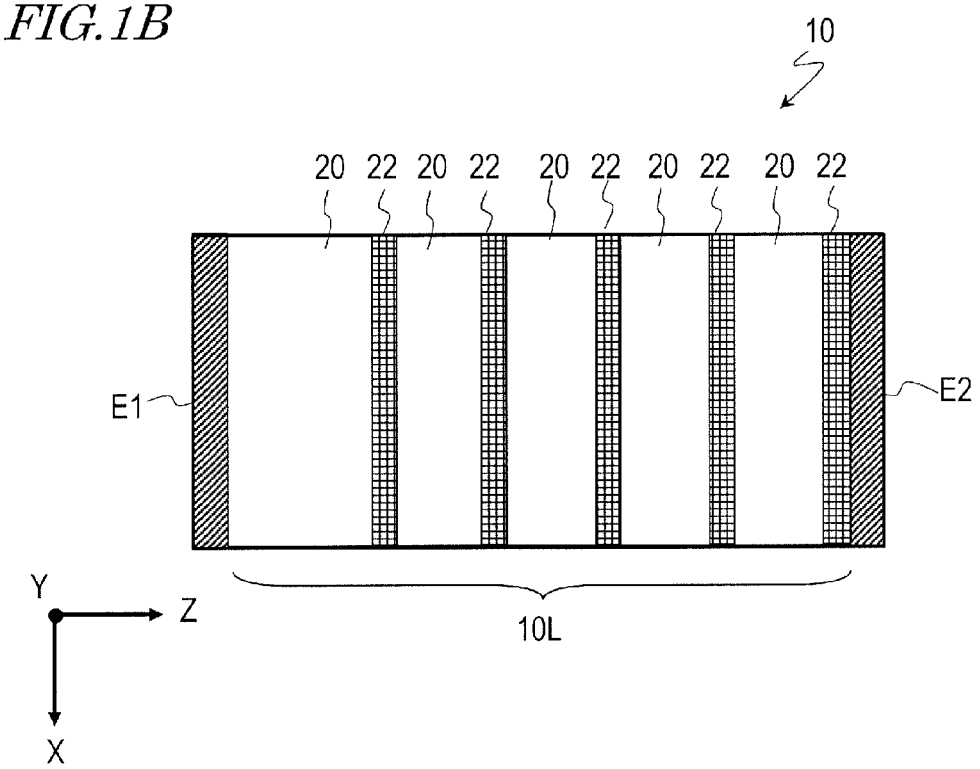
FIG. 1B is an upper plan view of a thermoelectric generator 10 in FIG. 1A.
Figure 2:
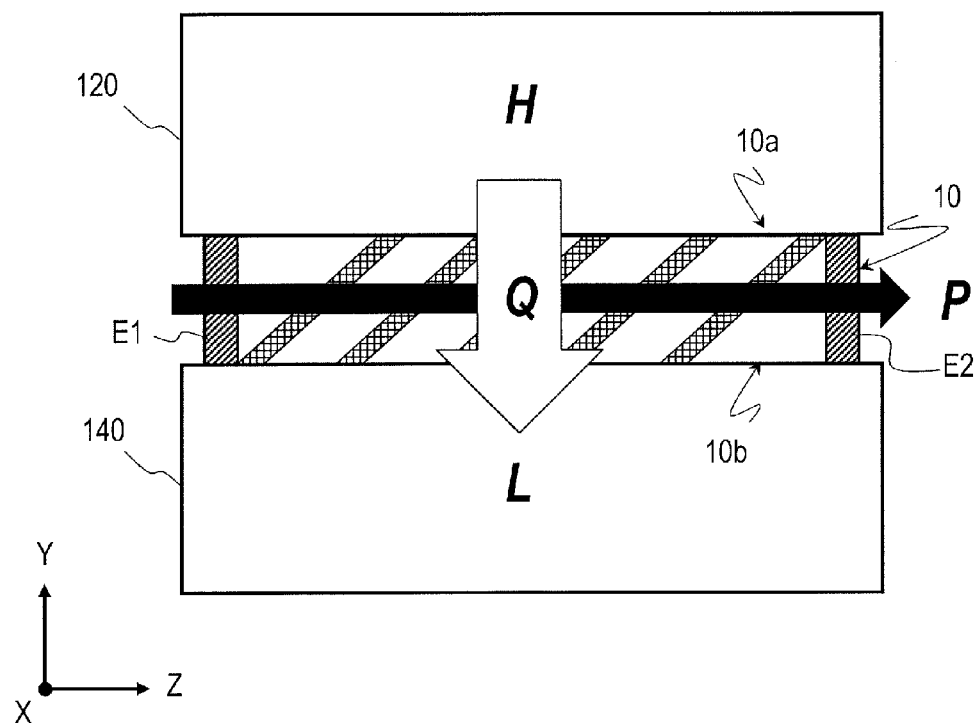
FIG. 2 is a diagram showing a state where a high-temperature heat source 120 is in contact with an upper face 10a of the thermoelectric generator 10, and a low-temperature heat source 140 is in contact with a lower face 10b.

First, FIG. 1A and FIG. 1B are referred to. FIG. 1A is a cross-sectional view showing an embodiment of the thermoelectric generator according to the present disclosure. FIG. 1B is an upper plan view of the thermoelectric generator 10. For reference sake, FIG. 1A and FIG. 1B show the X axis, the Y axis, and the Z axis, which are orthogonal to one another. The thermoelectric generator 10 shown in the figures includes a stacked body 10L and a first electrode E1 and a second electrode E2 opposing each other. The thermoelectric generator 10 has a first principal face 24 and a second principal face 26. In the example shown in FIG. 1A and FIG. 1B, the thermoelectric generator 10 is shaped as a generally rectangular solid, such that the first principal face 24 (which herein is a lower face 10b of the thermoelectric generator 10) and the second principal face 26 (which herein is an upper face 10a of the thermoelectric generator 10) are planes. Although the stacked body 10L has a rectangular solid shape in this example, the shape of the stacked body 10L is not limited to a rectangular solid.

The stacked body 10L has a first end face 25 and a second end face 27 which are located between the first principal face 24 and the second principal face 26, such that the first electrode E1 and the second electrode E2 are respectively electrically connected to the first end face 25 and the second end face 27. The stacked body 10L includes a plurality of first layers 20 and a plurality of second layers 22. The stacked body 10L is constructed so that the plurality of first layers 20 and the plurality of second layers 22 are alternately stacked. The planes of stacking between the first layers 20 and the second layers 22 in the stacked body 10L are, as shown in FIG. 1A, inclined with respect to the direction in which the first electrode E1 and the second electrode E2 oppose each other. In the present specification, the direction of a line connecting the first electrode E1 and the second electrode E2 may be referred to as the "stacking direction". As will be described later, the thermoelectric generator 10 creates a potential difference between the first electrode E1 and the second electrode E2, based on a temperature difference between the first principal face 24 and the second principal face 26.

The first layers 20 are made of a first material which contains a metal and particles having a lower thermal conductivity than that of the metal. Typically, the first layers 20 in the thermoelectric generator 10 are layers of a composite material, whose first material includes particles dispersed in the metal. In the present specification, the term "dispersion" may refer to substantially uniform dispersion, or any distributed dispersion, e.g., with locally higher particle densities, or changing particle densities from one side over to the other.

The metal in the first material may be selected from among arbitrary metal materials. Examples of the metal in the first material are nickel and cobalt. Nickel and cobalt are examples of metal materials exhibiting high thermoelectric generation characteristics. The metal in the first material may contain silver or gold. The metal in the first material may contain any of such exemplary metal materials alone, or an alloy of them. In the case where the metal in the first material is an alloy, this alloy may contain copper, chromium, or aluminum. Examples of such alloys are constantan, CHROMEL™, or ALUMEL™.

The particles in the first material may be any particles having a lower thermal conductivity than that of the metal in the first material, and may be made of any arbitrary material. Typically, the particles in the first material are inorganic particles. Examples of the particles in the first material are particles of oxides, such as silicon dioxide (silica), zirconia, yttria-stabilized zirconia, titanium oxide, aluminum oxide, zinc oxide, and tin oxide. As the particles in the first material, particles of an electrically conductive ceramic may also be used.

The particles are dispersed in the metal. Typically, the content amount of the particles in the first material is not less than 0.1 wt % and not more than 10 wt %. When the content amount of the particles is not less than 0.1 wt % and not more than 10 wt %, the thermoelectric generation characteristics of the thermoelectric generator are improved. The content amount of the particles may be not less than 1 wt % and not more than 5 wt %. When the content amount of the particles is not less than 1 wt % and not more than 5 wt %, the electric power which is obtained through power generation can be made even greater.

Typically, the particles in the first material have a particle size of not less than 5 nm and not more than 100 nm. In the present specification, the "particle size" of the particles in the first material or the second material refers to an arithmetic mean of diameters d1, d2, ..., dk (where k is an integer of 1 or more) of imaginary circles accommodating the particles in a cross-sectional image which is obtained by using a scanning electron microscope (SEM). In the present specification, the metal in the first material, or the second material, may also be described as being in the form of "particles".

The second layers 22 are made of a second material having a higher Seebeck coefficient and a lower thermal conductivity than those of the first material. Typically, the second material is a thermoelectric material, and the second layers 22 may be made of any arbitrary thermoelectric material depending on the temperature of use. Examples of thermoelectric materials that may be used for the second layers 22 includes: thermoelectric materials of a single element, such as Bi, Sb; alloy-type thermoelectric materials, such as BiTe-type, PbTe-type, and SiGe-type; and oxide-type thermoelectric materials, such as $Ca_xCoO_2$, $Na_xCoO_2$, and $SrTiO_3$. Typically, the "thermoelectric material" in the present specification is a material having a Seebeck coefficient with an absolute value of 30μ V/K or more and an electrical resistivity of 10 mΩ cm or less. Such a thermoelectric material may be crystalline or amorphous. In the case where the temperature of the high-temperature medium is about 200° C. or less, the second layers 22 may be made of a dense body of a BiSbTe alloy, for example. The representative chemical composition of a BiSbTe alloy is $Bi_{0.5}Sb_{1.5}Te_3$, but this is not a limitation. A dopant such as Se may be contained in BiSbTe. The mole fractions of Bi and Sb may be adjusted as appropriate.

Other examples of thermoelectric materials composing the second layers 22 are BiTe, PbTe, and so on. When the second layers 22 are made of BiTe, it may be of the chemical composition $Bi_2Te_X$, where $2<X<4$. A representative chemical composition is $Bi_2Te_3$. Sb or Se may be contained in $Bi_2Te_3$. A BiTe chemical composition containing Sb can be expressed as $(Bi_{1-Y}Sb_Y)_2Te_X$, where $0<Y<1$, and more preferably $0.6<Y<0.9$. Thus, in one implementation of the thermoelectric generator 10, the first material does not contain Bi but contains a metal different from Bi, while the second material contains Bi.

The materials composing the first electrode E1 and the second electrode E2 may be any material that has good electrical conductivity. The first electrode E1 and the second electrode E2 may be made of metals such as nickel, copper, silver, molybdenum, tungsten, aluminum, titanium, chromium, gold, platinum, and indium. Alternatively, they may be made of nitrides or oxides, such as titanium nitride (TiN), indium tin oxide (ITO), and tin dioxide ($SnO_2$). The first electrode E1 or second electrode E2 may be made of solder, silver solder, an electrically conductive paste, or the like. In the case where both ends of the stacked body 10L are first layers 20, the first layers 20 may serve as the first electrode E1 and the second electrode E2.

As has been described with reference to FIG. 1A, the planes of stacking between the first layers 20 and the second layers 22 in the stacked body 10L are inclined with respect to the direction in which the first electrode E1 and the second electrode E2 oppose each other. The angle of inclination θ of the planes of stacking in the stacked body 10L relative to the direction in which the first electrode E1 and the second electrode E2 oppose each other (hereinafter simply referred to as the "inclination angle") may be set within a range of not less than 5° and not more than 60°, for example. The inclination angle θ may be not less than 20° and not more than 45°. The appropriate range for the inclination angle θ differs depending on the combination of the first material composing the first layers 20 and the second material composing the second layers 22. For example, when the first layers 20 are made of a first material which is a mixture of nickel and silica particles and the second layers 22 are made of a BiSbTe alloy such as $Bi_{0.5}Sb_{1.5}Te_3$, the inclination angle θ may be not less than 5° and not more than 45°.

The ratio between the thickness of each first layer and the thickness of each second layer 22 (hereinafter simply referred to as the "stacking ratio") in the stacked body 10L may be set within the range of 20:1 to 1:9, for example. Herein, the thickness of each first layer 20 means a thickness along a direction which is perpendicular to the planes of stacking (i.e., the thickness indicated as Th in FIG. 1A). Similarly, the thickness of each second layer 22 means a thickness along a direction which is perpendicular to the planes of stacking. For example, when the first layers 20 are made of a first material which is a mixture of nickel and silica particles and the second layers 22 are made of a BiSbTe alloy such as $Bi_{0.5}Sb_{1.5}Te_3$, the stacking ratio may be set within the range of 1:9 to 9:1. By setting the stacking ratio within the range of 1:9 to 9:1, a greater electric power can be obtained. Note that the total numbers of first layers 20 and second layers 22 being stacked can be appropriately set.

<Operation Principles of Thermoelectric Generator>

Next, operation principles of the thermoelectric generator will be described in outline.

In the thermoelectric generator 10 shown in FIG. 1A and FIG. 1B, the first electrode E1 and the second electrode E2 are provided in a manner of sandwiching the aforementioned stacked body 10L on the left and on the right. In the cross section shown in FIG. 1A, the planes of stacking are inclined by an angle θ (0<θ<π radians) with respect to the Z axis direction.

In the thermoelectric generator 10 having such a construction, when a temperature difference is introduced between the upper face 10a and the lower face 10b, heat propagates primarily through the first layers 20 whose thermal conductivity is higher than that of the second layers 22, so that a Z axis component occurs in the temperature gradient of each second layer 22. Therefore, an electromotive force along the Z axis direction occurs in each second layer 22 due to the Seebeck effect, these electromotive forces being superposed in series within the stacked body. Consequently, as a whole, a large potential difference occurs between the first electrode E1 and the second electrode E2.

FIG. 2 shows a state where the high-temperature heat source 120 is in contact with the upper face 10a of the thermoelectric generator 10 and the low-temperature heat source 140 is in contact with the lower face 10b. In this state, heat Q flows from the high-temperature heat source 120 to the low-temperature heat source 140 via the thermoelectric generator 10, so that electric power P can be retrieved from the thermoelectric generator 10 via the first electrode E1 and the second electrode E2. From a macroscopic point of view, in the thermoelectric generator 10, the direction of temperature gradient (the Y axis direction) and the direction of the electric current (the Z axis direction) are orthogonal, so that there is no need to introduce a temperature difference between the pair of electrodes E1 and E2 for taking out electric power. The example shown in FIG. 2 schematically illustrates a manner in which electric power P flows from the left to the right in the figure; however, this is only an example. For example, by changing the type of the thermoelectric material used for the thermoelectric generator 10, the flow direction of the electric power P may be reversed from that in FIG. 2.

Thus, with the thermoelectric generator 10, unlike in conventional thermoelectric generators, the direction of temperature gradient and the direction of electric current flow can be made orthogonal. This permits a positioning of the high-temperature heat source and low-temperature heat source which was not easy for conventional thermoelectric generators to attain, whereby a practical thermoelectric generator can be provided.

<Thermoelectric Generator Having Tube Shape>

As described earlier, the shape of the stacked body of the thermoelectric generator is not limited to a rectangular solid. Hereinafter, an example of a thermoelectric generator whose stacked body has a tube shape will be illustrated. Such a tubular-shaped thermoelectric generator will be referred to as a "thermoelectric generation tube (tubular thermoelectric generator)" in the present specification. In the present specification, the term "tube" is interchangeably used with the term "pipe", and is to be interpreted to encompass both a "tube" and a "pipe". When the thermoelectric generator according to the present disclosure is tubular, it may be easier to utilize the high-temperature heat source and the low-temperature heat source.

Figure 3A:
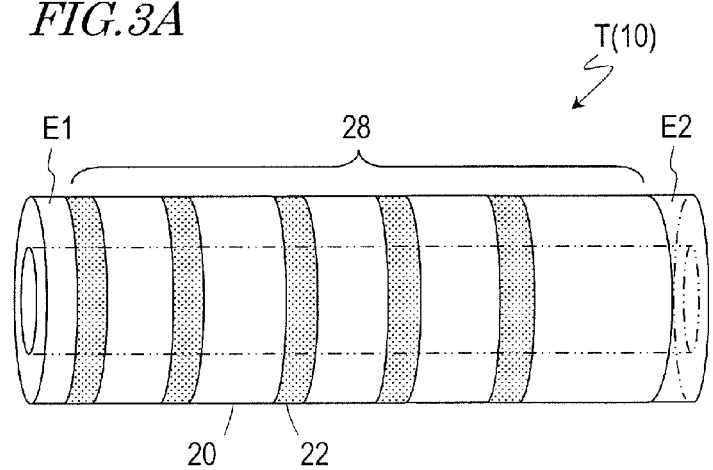
FIG. 3A is a perspective view showing an exemplary thermoelectric generator (thermoelectric generation tube) T with a tube-shaped stacked body.
Figure 3B:
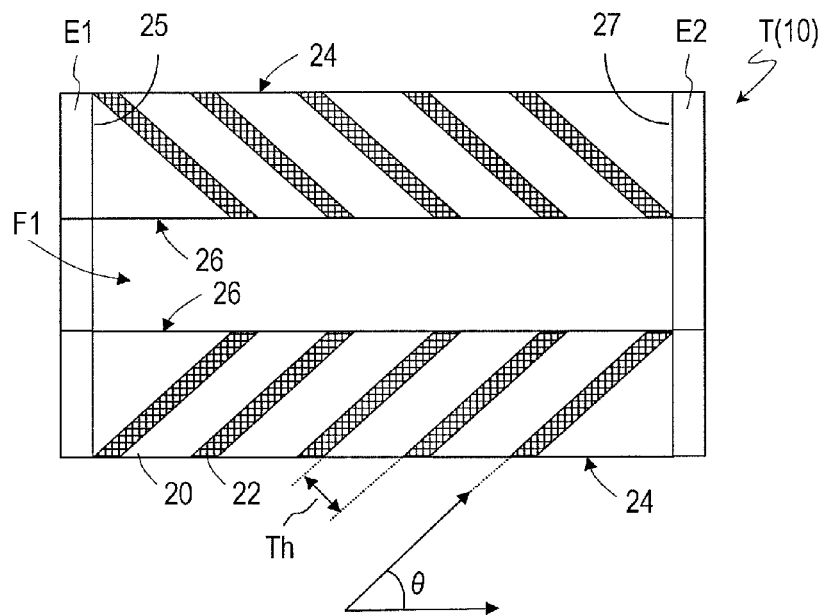
FIG. 3B is a diagram showing a cross section where the thermoelectric generation tube T is cut along a plane which contains the axis (center axis) of the thermoelectric generation tube T.

FIG. 3A is a perspective view showing an exemplary thermoelectric generator (thermoelectric generation tube) T whose stacked body has a tube shape, and FIG. 3B is a diagram showing a cross section where the thermoelectric generation tube T is cut along a plane which contains the axis (center axis) of the thermoelectric generation tube T. As shown in FIG. 3A, the stacked body 28 of the thermoelectric generation tube T has a tubular shape. The shape of the thermoelectric generation tube T may be anything tubular, without being limited to cylindrical. In other words, when the thermoelectric generation tube T is cut along a plane which is perpendicular to the axis of the thermoelectric generation tube T, the resultant shapes created by sections of the "outer peripheral surface" and the "inner peripheral surface" do not need to be circles, but may be any closed curves, e.g., ellipses or polygons. Although the axis of the thermoelectric generation tube T is typically linear, it is not limited to being linear.

The thermoelectric generation tube T includes the stacked body 28 and a first electrode E1 and a second electrode E2. The stacked body 28 has a first end face 25 and a second end face 27 that are located between an outer peripheral surface 24 which is the first principal face and an inner peripheral surface 26 which is the second principal face, such that the first electrode E1 and the second electrode E2 are respectively electrically connected to the first end face 25 and the second end face 27. The stacked body 28 includes a plurality of first layers 20 and a plurality of second layers 22. The first layers 20 and the second layers 22 are alternately stacked.

A region which is defined by the inner peripheral surface 26 forms a flow path F1. In the illustrated example, cross sections of the outer peripheral surface 24 and the inner peripheral surface 26 taken perpendicular to the axial direction each present the shape of a circle. However, these shapes are not limited to circles, but may be ellipses or polygons, as mentioned earlier.

In the illustrated example, the first electrode E1 and the second electrode E2 both have cylindrical shapes. However, the shapes of the first electrode E1 and the second electrode E2 are not limited thereto. At or near the respective end of the stacked body 28, the first electrode E1 and the second electrode E2 may each have any arbitrary shape which is electrically connectable to at least one of a first layer 20 or a second layer 22 and which does not obstruct the flow path F1. In the example shown in FIG. 3B, the first electrode E1 and the second electrode E2 have outer peripheral surfaces conforming to the outer peripheral surface 24 of the stacked body 28; however, it is not necessary for the outer peripheral surfaces of the first electrode E1 and the second electrode E2 to conform to the outer peripheral surface 24 of the stacked body 28. For example, the first electrode E1 and the second electrode E2 may have outer peripheral surfaces with a diameter (outer diameter) which is greater or smaller than the diameter (outer diameter) of the outer peripheral surface 24 of the stacked body 28. Moreover, the cross-sectional shapes of the first electrode E1 and the second electrode E2 taken along a plane which is perpendicular to the axial direction may differ from the cross-sectional shape of the outer peripheral surface 24 of the stacked body 28 taken along a plane which is perpendicular to the axial direction.

The first electrode E1 and the second electrode E2 are made of an electrically conductive material, typically a metal. The first electrode E1 or the second electrode E2, or both, may be composed of one or more first layers 20 located at or near the respective end of the stacked body 28. In that case, it can be said that the stacked body 28 partially functions as the first electrode E1 and the second electrode E2. Alternatively, the first electrode E1 and the second electrode E2 may be made of metal layers or annular metal members which partially cover the outer peripheral surface of the stacked body 28, or a pair of cylindrical metal members fitted partially into the flow path F1 from both ends of the stacked body 28 so as to be in contact with the inner peripheral surface of the stacked body 28.

As shown in FIG. 3B, the first layers 20 and the second layers 22 are alternately stacked while being inclined. A thermoelectric generator with such a construction basically operates under similar principles to the principles which have been described with reference to FIG. 2. Therefore, when a temperature difference is introduced between the outer peripheral surface 24 and the inner peripheral surface 26 of the thermoelectric generation tube T, a potential difference occurs between the first electrode E1 and the second electrode E2. The general direction of the temperature gradient is a perpendicular direction to the outer peripheral surface 24 and the inner peripheral surface 26.

The thermoelectric generation tube T may be connected to conduits so that a high-temperature medium, for example, flows in the flow path which is defined by the inner peripheral surface 26 in its interior (which hereinafter may be referred to as the "internal flow path"). In that case, the outer peripheral surface of the thermoelectric generation tube T is placed in contact with a low-temperature medium. Thus, by introducing a temperature difference between the inner peripheral surface and the outer peripheral surface of the thermoelectric generation tube T, a potential difference occurs between the pair of electrodes E1 and E2, thereby enabling electric power to be retrieved. Note that there is no particular limitation as to the size of the cross-sectional area of the flow path when cut along a plane which is perpendicular to the axial direction. The cross-sectional area of the flow path may be appropriately set in accordance with the flow rate of a medium which is supplied in the internal flow path of the thermoelectric generation tube T.

When any reference is made to a "high-temperature medium" or a "low-temperature medium" in the present specification, the terms "high temperature" and "low temperature" indicate relative highness or lowness of temperature between them, rather than any specific temperatures of these media. A "medium" is typically a gas, a liquid, or a fluid composed of a mixture thereof. A "medium" may contain solid, e.g., powder, which is dispersed within a fluid.

According to the present embodiment, the first material includes particles which are dispersed in the metal, whereby the thermal conductivity of the first material can be lowered. As a result, a temperature increase in the one of the first and second principal faces that is in contact with the low-temperature heat source can be suppressed. In this case, the electrical resistivity of the first material may increase as a result of the particles being dispersed in the metal of the first material. However, as will be illustrated by way of Examples described later, a thermoelectric generator constructed so that the first layers and the second layers are alternately stacked while being inclined can have an increased output electric power so long as a product $\kappa \rho$ of a thermal conductivity $\kappa$ and an electrical resistivity $\rho$ of the first material is substantially constant. Thus, according to an embodiment of the present disclosure, a temperature difference between the first principal face and the second principal face can be effectively utilized, thereby suppressing thermal losses.

<Embodiment of Production Method for Thermoelectric Generator>

Next, a production method for a thermoelectric generator according to an embodiment of the present disclosure will be described. Hereinafter, a production method for a thermoelectric generator whose stacked body has a tube shape will be described as an example.

First, a compact (first compact) of a source material for the first material composing the first layers 20 is provided. For example, powder of a source material for the first material composing the first layers 20 is provided, and this powder is compacted by using a hydraulic press or the like, thus forming a first compact 20'.

The source material powder for the first material contains metal powder and particles having a lower thermal conductivity than that of the metal. As the source material powder for the first material, for example, a mixture of nickel powder and silica powder (particles) can be used. In this case, after the nickel powder and the silica powder are weighed, these are mixed. Mixing of the nickel powder and the silica powder may be achieved through a dry blending that utilizes a mortar, a ball mill, or the like. A wet blending utilizing a dispersing agent or the like may be adopted instead. Mixing particles such as silica powder in the metal powder also improves the moldability of the first compact 20' (the first layers 20).

The particle size of the particles of the metal (e.g., nickel) composing a source material for the first material is typically not less than 2 µm and not more than 75 µm. The particle size of the particles having a lower thermal conductivity than that of the metal (e.g., silica particles) composing the source material for the first material is typically not less than 1 nm and not more than 50 nm. Note that the "particle size" of any source material as used in the present specification refers to an arithmetic mean of diameters e1, e2, ..., eh (where h is an integer of one or more) of imaginary circles accommodating particles which are observed of the source material powder by using a scanning electron microscope (SEM).

Furthermore, similarly to the first layers 20, a compact (second compact) of a source material for the second material composing the second layers 22 is provided. The second compact 22' is made of a source material for a second material having a higher Seebeck coefficient and a lower thermal conductivity than those of the first material. As such a source material, for example, powder of $Bi_{0.5}Sb_{1.5}Te_3$ can be used. There is no particular limitation as to the method of producing $Bi_{0.5}Sb_{1.5}Te_3$. For example, Bi, Sb, and Te, at predetermined proportions, may be melted to obtain an alloy, and this alloy may be pulverized after being cooled, whereby powder of $Bi_{0.5}Sb_{1.5}Te_3$ is obtained. As will be described later, a dense sintered body of $Bi_{0.5}Sb_{1.5}Te_3$, for example, can be obtained by sintering the second compact 22'.

Figure 4:
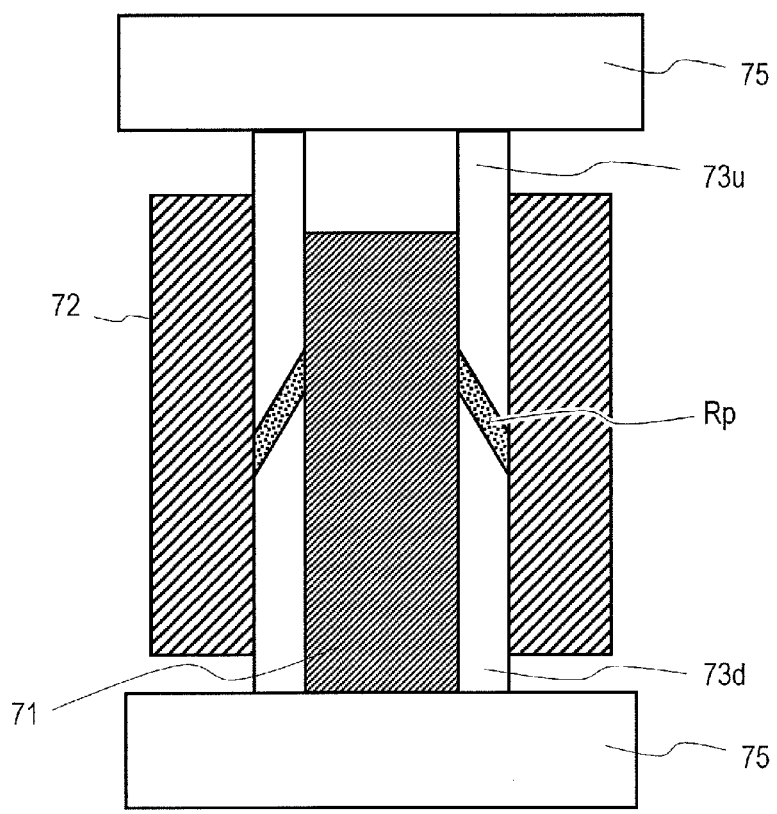
FIG. 4 is an exemplary step diagram showing a production step for a thermoelectric generator.

FIG. 4 is an exemplary step diagram showing a production step for a thermoelectric generator. FIG. 4 shows a cross-sectional view. As shown in FIG. 4, source material powder Rp (source material powder for the first material or source material powder for the second material) is poured into a space that is defined by a rod 71, a die 72, and a lower punch 73d, which are provided in advance. Thereafter, an upper punch 73u is inserted, and the source material powder Rp is compressed from above and below via the upper punch 73u, the lower punch 73d, and the spacer 75, by using a hydraulic press or the like. By repeating this process, a plurality of first compacts 20' and a plurality of second compacts 22' are obtained.

Figure 5:
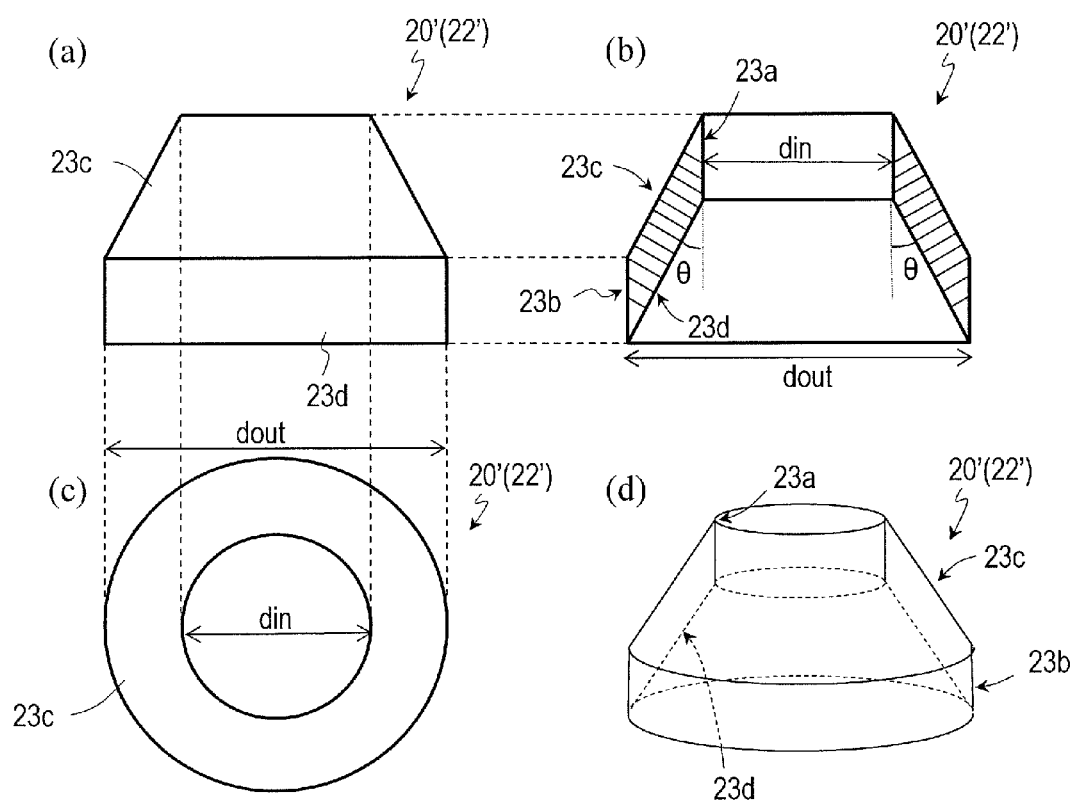
FIG. 5 includes (a) to (d), which are a side view, a cross-sectional view, an upper plan view, and a perspective view illustrating the shape of a compact from which a stacked body is made.

In FIG. 5, (a) to (d) are respectively a side view, a cross-sectional view, an upper plan view, and a perspective view showing the shape of a first compact 20' made of a source material for the first material or a second compact 22' made of a source material for the second material. The first compact 20' and the second compact 22' each have a tubular shape having an inner peripheral surface 23a and an outer peripheral surface 23b. The inner peripheral surface 23a and the outer peripheral surface 23b are connected by a plane of stacking 23c and a plane of stacking 23d, which are shaped as truncated cones. Stated otherwise, between the plane of stacking 23c and the plane of stacking 23d, each first compact 20' or second compact 22' has the inner peripheral surface 23a and the outer peripheral surface 23b, which are not perpendicular thereto. The diameters of cylinders which are formed by the inner peripheral surface 23a and the outer peripheral surface 23b are denoted as din and dout, respectively, in FIG. 5(c). When viewed in a cross section through the axis of the tubular shape (FIG. 5(b)), the plane of stacking 23c and the plane of stacking 23d constitute an angle θ with respect to the inner peripheral surface 23a.

Figure 6A:
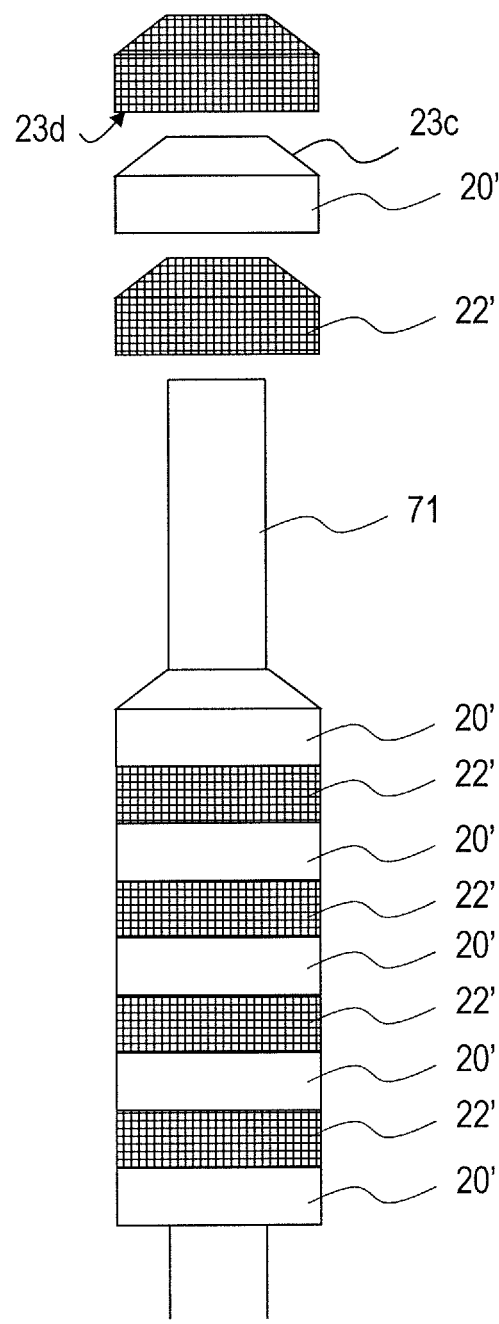
FIG. 6A is an exemplary step diagram showing a production step for a thermoelectric generator.
Figure 6B:
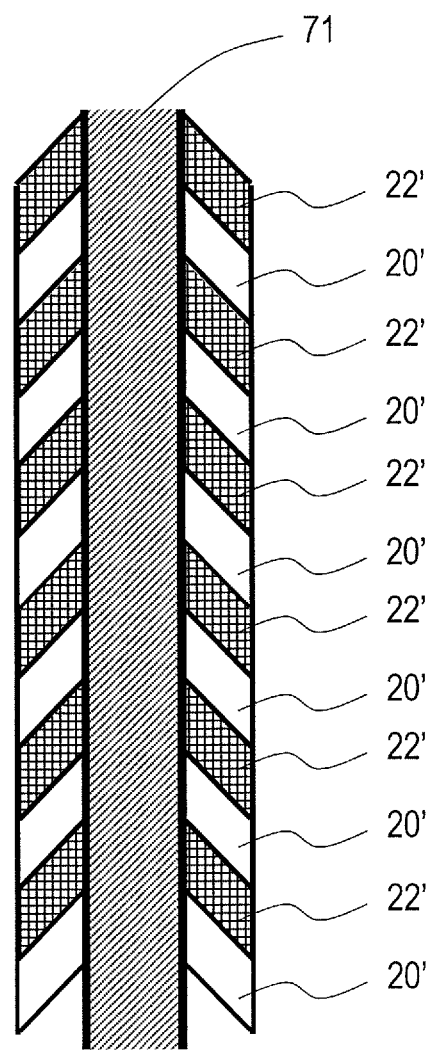
FIG. 6B is a cross-sectional view corresponding to FIG. 6A.

Next, a multilayer compact in which a plurality of first compacts 20' and a plurality of second compacts 22' are alternately stacked is formed. In this example as shown in FIG. 6A, the rod 71 is inserted alternately through the first compacts 20' and the second compacts 22', thus stacking the first compacts 20' and the second compacts 22'. At this time, between each adjoining pair of first and second compacts 20' and 22', the plane of stacking 23c and the plane of stacking 23d abut each other. FIG. 6B shows the stacked first compacts 20' and second compacts 22' in cross section. As necessary, a release agent is applied to the outer peripheral surface of the rod 71 to suppress adhesion between the outer peripheral surface of the rod 71 and the inner peripheral surfaces 23a of the first compacts 20' and the second compacts 22'. For example, prior to insertion into the first compacts 20' and the second compacts 22', carbon sheet may be wrapped around the rod 71.

Figure 7A:
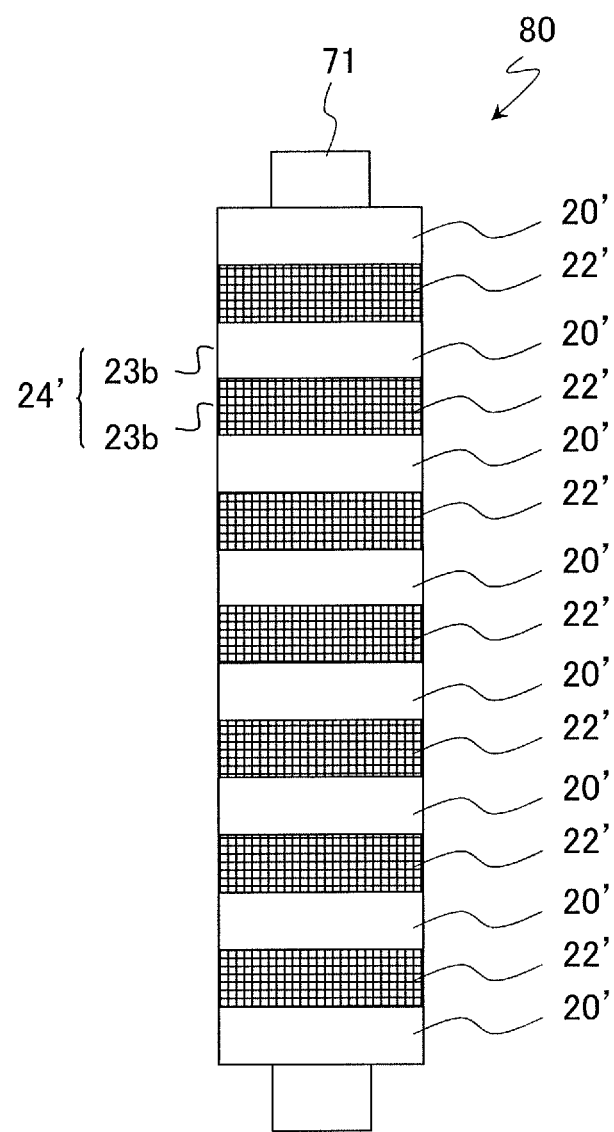
FIG. 7A is an exemplary step diagram showing a production step for a thermoelectric generator.

FIG. 7A shows a multilayer compact 80 in which stacking of the first compacts 20' and the second compacts 22' is complete. The outer peripheral surfaces 23b of the first compacts 20' and the second compacts 22' constitute the outer peripheral surface 24' of the multilayer compact 80.

Figure 7B:
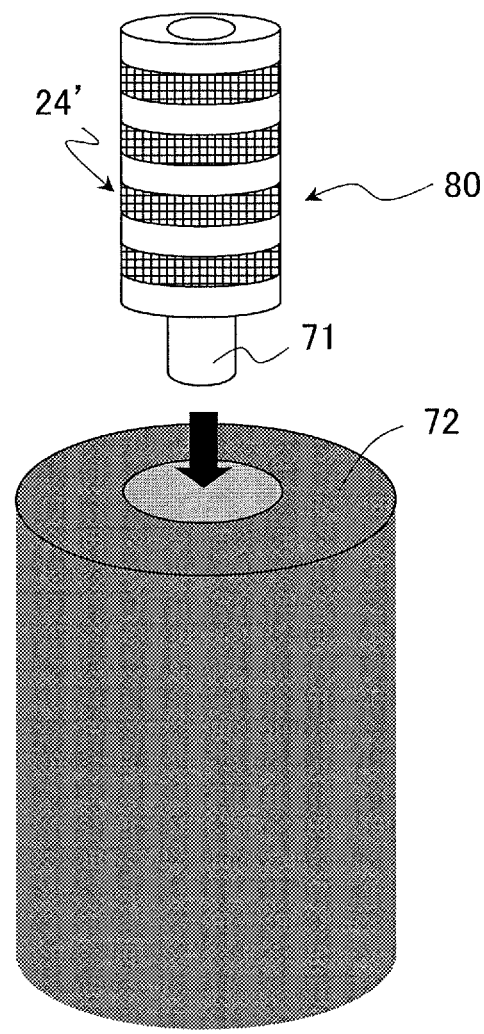
FIG. 7B is an exemplary step diagram showing a production step for a thermoelectric generator.

Next, as shown in FIG. 7B, the multilayer compact 80 is inserted into the space of the die 72. At this point, carbon sheet may have been wrapped around on the outer peripheral surface 24' of the multilayer compact 80. This can suppress adhesion between outer peripheral surface 24' of the multilayer compact 80 and the inner peripheral surface of the die 72.

Next, the multilayer compact 80 is sintered. For sintering, for example, a hot pressing technique or a spark plasma sintering (SPS) technique may be applied. An appropriate temperature may be selected for the sintering depending on the source material for the first material and the source material for the second material, the configuration of the source material powder, and the like. For example, when a mixture of nickel powder and silica powder is used for the first compacts 20' and powder of a BiSbTe alloy is used for the second compacts 22', an appropriate temperature can be selected within the range of not less than 200° C. and not more than 600° C.

Figure 8:
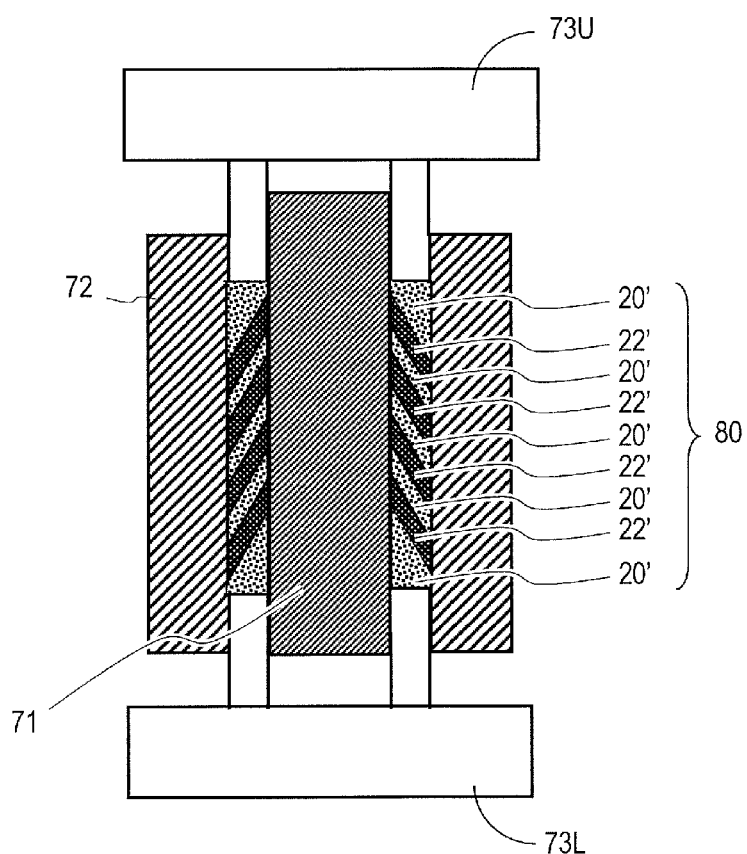
FIG. 8 is an exemplary step diagram showing a production step for a thermoelectric generator.

In order to obtain a dense sintered body, the multilayer compact 80 may be pressurized during sinter. FIG. 8 shows a cross section of the multilayer compact 80. For example, a pressure may be applied from both ends of the tubular shape by using jigs 73U and 73L as shown in FIG. 8, whereby the multilayer compact 80 receives pressure in three directions within the die 72. When spark plasma sintering is adopted, a DC pulse voltage is applied to the multilayer compact 80 and the die 72 via the jigs 73U and 73L. The multilayer compact 80 is heated by this applied pulse voltage. As a result of this, the first compacts 20' and the second compacts 22' are sintered, and joining occurs between the first compacts 20' and the second compacts 22', which are of different materials. The sintered body which is obtained through the sintering step may be worked into a desired shape, e.g., a plate shape or a disk shape, by cutting, grinding, or the like.

Thereafter, a first electrode E1 is formed at one end (first end face 25) of the tubular-shaped sintered body, and a second electrode E2 is formed at the other end (second end face 27). A vapor deposition technique or a sputtering technique may be adopted in forming the first electrode E1 and the second electrode E2 for example. The first electrode E1 and the second electrode E2 may also be formed via application of an electrically conductive paste, plating, thermal spraying, soldering, or the like. In the case where both ends of the sintered body are first layers 20 made of the first material, formation of the first electrode and the second electrode may be omitted. In order to facilitate electrode formation, both ends of the sintered body may be ground in advance so as to become planar.

Thus, the first electrode E1 and the second electrode E2 are electrically coupled respectively to the first end face 25 and the second end face 27, whereby the thermoelectric generator is completed.

Although the above production method illustrates formation of the multilayer compact 80 via alternate stacking of the plurality of first compacts 20' and the plurality of second compacts 22', this example is not a limitation. For example, cups which are formed by a casting method may be stacked to form a stacked body. The sintered bodies of the first compacts 20' and the sintered bodies of the second compacts 22' may be joined to one another via soldering or the like.

In the case of producing a thermoelectric generator whose stacked body has a rectangular solid shape, for example, a stacked body (sintered body) having a rectangular solid shape may be formed, and thereafter the stacked body may be cut into shape in a manner of obliquely traversing the planes of stacking, as is described in Patent Document 2. First compacts and second compacts having parallelepiped shapes may be formed, and these may be alternately stacked, followed by sintering.

EXAMPLES

Thermoelectric generators according to the present embodiment were produced under the following conditions, and their characteristics were examined.

Example 1

A thermoelectric generator having a plate shape was produced, and its output electric power was evaluated.

First, as the source material for the first material, nickel powder and silica powder as the particles were provided. The particle size of the nickel powder was in the range of not less than 3 μm and not more than 5 μm, and the particle size of the silica powder was 7 nm. The content amount of silica powder in the first material was 0.1 wt %. Next, these were mixed through a dry blending using a ball mill, thereby obtaining a mixture of nickel and silica (source material for the first material). Mixing of the nickel powder and the silica powder was conducted for 5 minutes under the condition of 1000 rotations per unit time. As the source material for the second material, powder of $Bi_{0.5}Sb_{1.5}Te_3$ was provided. The particle size of the $Bi_{0.5}Sb_{1.5}Te_3$ powder was in the range of more than 0 μm but not more than 75 μm.

Next, from the source material for the first material and the source material for the second material, a first compact and a second compact were respectively formed, and these were sintered via spark plasma sintering. The temperature and pressure during sinter were set to approximately 500° C. and 50 MPa, respectively. The atmosphere during sinter was a $5×10^{-3}$ Pa vacuum. Thus, disk-shaped sintered bodies were obtained. The dimensions of each sintered body were as follows: a diameter of approximately 30 mm and a thickness of approximately 5 mm.

Next, by using a wire saw, a plurality of sintered pieces of rectangular solid shape were made from each resultant sintered body. The dimensions of each sintered piece were as follows: a depth of approximately 20 mm, a width of approximately 1 mm, and a height of approximately 5 mm. Then, while adjusting the planes of stacking to an inclination angle of 30°, sintered pieces of the first material and sintered pieces of the second material were alternately stacked, thus forming a stacked body. At this time, it was ensured that sintered pieces of the first material were placed at both ends of the stacked body. The sintered pieces were joined by using solder.

After a first electrode and a second electrode of nickel were joined to the stacked body, the stacked body was polished until its upper face and lower face were flat. As a result, the thermoelectric generator of Example 1-1, whose stacked body has a rectangular solid shape, was obtained. The thermoelectric generator of Example 1-1 had a depth, a width, and a height of 20 mm, 20 mm, and 2 mm, respectively, and the first layers and the second layers had an average thickness of approximately 1 mm each.

Moreover, in a similar manner to the thermoelectric generator of Example 1-1 except for changing the content amount of silica powder in the first material, thermoelectric generators of Example 1-2, Example 1-3, Example 1-4, Example 1-5, Comparative Example 1-1, and Comparative Example 1-2 were produced. In the thermoelectric generators of Example 1-2, Example 1-3, Example 1-4, Example 1-5, Comparative Example 1-1, and Comparative Example 1-2, respectively, the content amount of silica powder in the first material was 1 wt %, 2 wt %, 5 wt %, 10 wt %, 0 wt %, and 20 wt %.

Next, the output electric power of each thermoelectric generator was evaluated according to the following procedure.

Figure 9:
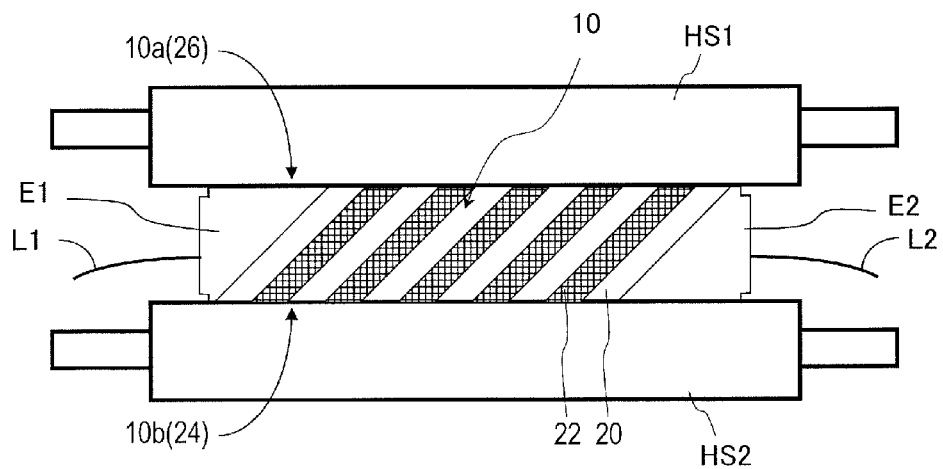
FIG. 9 is a schematic illustration showing an exemplary construction for introducing a temperature difference between the upper face and the lower face of a stacked body of a thermoelectric generator.

FIG. 9 is a schematic illustration of an exemplary construction for introducing a temperature difference between the upper face and the lower face of the stacked body of each thermoelectric generator. As shown in FIG. 9, by using API-EZON™ grease, copper heat sinks HS1 and HS2 were fixed respectively on the lower face 10b (first principal face 24) and the upper face 10a (second principal face 26) of the stacked body of the thermoelectric generator 10. On the surface of each heat sink, an aluminum nitride layer with a thickness of 1 μm was provided as an insulative coating, and a copper pipe was placed inside each heat sink. By introducing hot water or cold water into the pipe inside the heat sink, the heat sink can be heated or cooled. Furthermore, by using an indium material, copper wires L1 and L2 were respectively connected to the first electrode E1 and the second electrode E2. Electric power generated by the thermoelectric generator 10 can be measured via the copper wires L1 and L2.

During measurement of output electric power, cold water at 10° C. was introduced to one of the heat sinks HS1 and HS2, while hot water at 90° C. was introduced to the other, thereby introducing a temperature difference between the first principal face 24 and the second principal face 26 of the thermoelectric generator 10. The flow rate of the cold water and the flow rate of the hot water were adjusted to L/min. The output electric powers of the thermoelectric generators are shown in Table 1 below.

TABLE 1

| | content amount of SiO$_2$ (silica powder) (wt %) | electric power (W) |
|---|---|---|
| Comparative Example 1-1 | 0 | 0.7 |
| Example 1-1 | 0.1 | 1.3 |
| Example 1-2 | 1 | 1.8 |
| Example 1-3 | 2 | 2.0 |
| Example 1-4 | 5 | 1.8 |
| Example 1-5 | 10 | 0.9 |
| Comparative Example 1-2 | 20 | 0.4 |

Table 1 indicates that the thermoelectric generation characteristics of the thermoelectric generator are improved by forming the first layers from a first material containing a metal (which herein is nickel) and particles (which herein are silica) having a lower thermal conductivity than that of the metal, as compared to the case where the first material does not contain the particles. Table 1 also indicates that, by ensuring that the content amount of the particles in the first material is not less than 0.1 wt % and not more than 10 wt %, increased electric power is obtained through power generation.

Example 2

A thermoelectric generator having a tube shape (which hereinafter may be referred to as a thermoelectric generation tube) was produced, and its output electric power was evaluated.

Similarly to Example 1, first, as the source material for the first material, nickel powder and silica powder as the particles were provided. The content amount of silica powder in the first material was 0.1 wt %. Next, these were mixed through a dry blending using a ball mill, thereby obtaining a mixture of nickel and silica (source material for the first material). As the source material for the second material, powder of $Bi_{0.5}Sb_{1.5}Te_3$ was provided.

Next, from the source material for the first material and the source material for the second material, first compacts and second compacts of the shape shown in (a) to (d) of FIG. 5 were produced. The inner diameter (din in FIG. 5) and the outer diameter (dout in FIG. 5), height, and angle θ of the first compacts and the second compacts were, respectively, 10 mm, 14 mm, 6.4 mm, and 30°. Herein, eight first compacts and seven second compacts were produced.

Next, the first compacts and the second compacts were alternately stacked to form a multilayer compact, and this multilayer compact was sintered via spark plasma sintering. The temperature and pressure during sinter were set to approximately 500° C. and 100 MPa, respectively. The atmosphere during sinter was a 5×10$^{-3}$ Pa vacuum. Thus, a sintered body having a generally tubular shape was obtained.

The aforementioned sintered body production was repeated four times to thereby obtain four sintered bodies. Thereafter, these were joined so as to extend along the axial direction by using solder. Then, the tubular shape were cut at both ends, followed by planarization. At this time, it was ensured that first layers of the first material were placed at both ends of the thermoelectric generation tube. Thus, the thermoelectric generation tube of Example 2-1 was obtained.

Similarly to the thermoelectric generation tube T shown in FIG. 3B, the thermoelectric generation tube of Example 2-1 had a throughhole (internal flow path) along the axial direction, and the first layers and the second layers were alternately stacked while being inclined. The first layers and the second layers had an average thickness of approximately 1.3 mm each, and the inclination angle of the planes of stacking was 30°. The thermoelectric generation tube of Example 2-1 had a length along the axial direction, an outer diameter, and an inner diameter of, respectively, approximately 110 mm, 14 mm, and 10 mm.

Moreover, in a manner similar to the thermoelectric generation tube of Example 2-1 except for changing the content amount of silica powder in the first material, thermoelectric generation tubes of Example 2-2, Example 2-3, Example 2-4, Example 2-5, Comparative Example 2-1, and Comparative Example 2-2 were produced. In the thermoelectric generation tubes of Example 2-2, Example 2-3, Example 2-4, Example 2-5, Comparative Example 2-1, and Comparative Example 2-2, respectively, the content amount of silica powder in the first material was, 1 wt %, 2 wt %, 5 wt %, 10 wt %, 0 wt %, and 20 wt %.

Next, the output electric power of each thermoelectric generation tube was evaluated according to the following procedure.

Figure 10:
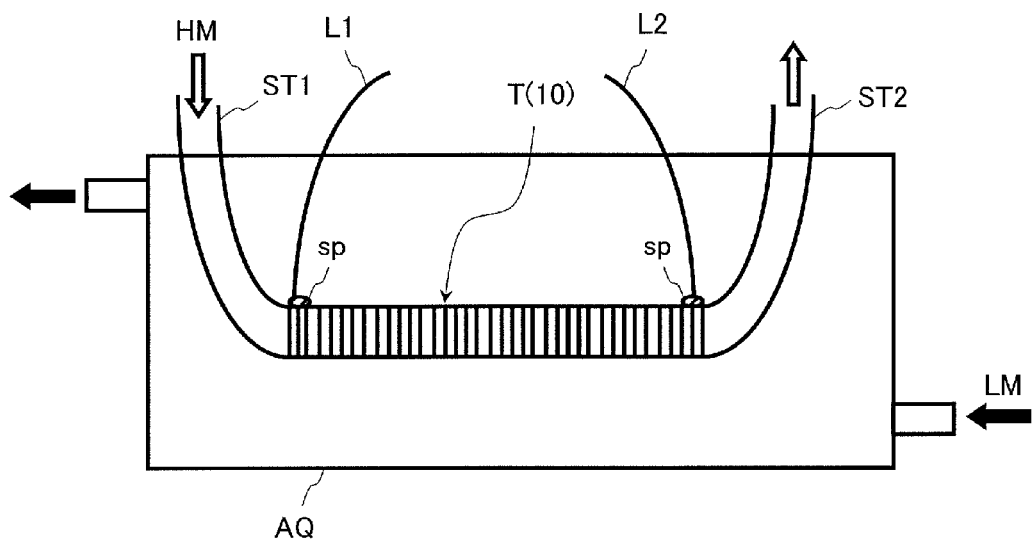
FIG. 10 is a schematic illustration showing an exemplary construction for introducing a temperature difference between the outer peripheral surface and the inner peripheral surface of a thermoelectric generation tube.

FIG. 10 is a schematic illustration showing an exemplary construction for introducing a temperature difference between the outer peripheral surface and the inner peripheral surface of each thermoelectric generation tube. As shown in FIG. 10, silicone tubes ST1 and ST2 each having a throughhole are connected to the two ends of the thermoelectric generation tube T. In this state, the internal flow path of the thermoelectric generation tube T is in communication with the throughholes of the silicone tubes ST1 and ST2. Moreover, by using an indium material sp, a copper wire L1 was connected to one end (i.e., the first layer at that end) of the thermoelectric generation tube T. Similarly, by using an indium material sp, a copper wire L2 was connected at the other end (i.e., the first layer at that end) of the thermoelectric generation tube T. Via the copper wires L1 and L2, electric power which is generated by the thermoelectric generation tube T can be measured.

During measurement of output electric power, as shown in FIG. 10, the thermoelectric generation tube T was submerged in a water tank AQ, which was filled with cold water as the low-temperature medium LM. As is schematically indicated by a black arrow in FIG. 10, the water tank AQ was constructed so that cold water could circulate therein. The flow rate of the cold water introduced in the water tank AQ was 5 L/min. As a result, the cold water in the water tank AQ was maintained at a temperature of 10° C. With the thermoelectric generation tube T being submerged in the water tank AQ, as schematically indicated by a white arrow in FIG. 10, hot water as the high-temperature medium HM was circulated through the internal flow path of the thermoelectric generation tube T, via the silicone tube ST1. The temperature and flow rate of the hot water were set to 90° C. and 5 L/min, respectively. The output electric powers of the thermoelectric generation tubes are shown in Table 2 below.

TABLE 2

|  | content amount of SiO$_2$ (silica powder) (wt %) | electric power (W) |
| --- | --- | --- |
| Comparative Example 2-1 | 0 | 1.0 |
| Example 2-1 | 0.1 | 1.8 |
| Example 2-2 | 1 | 2.5 |
| Example 2-3 | 2 | 2.8 |
| Example 2-4 | 5 | 2.6 |
| Example 2-5 | 10 | 1.3 |
| Comparative Example 2-2 | 20 | 0.5 |

Table 2 indicates that the thermoelectric generation characteristics of the thermoelectric generator are improved by forming the first layers from a first material containing a metal (which herein is nickel) and particles (which herein are silica) having a lower thermal conductivity than that of the metal, as compared to the case where the first material does not contain the particles. Table 2 also indicates that, by ensuring that the content amount of the particles in the first material is not less than 0.1 wt % and not more than 10 wt %, the resultant output electric power is increased by about three times at the maximum, as compared to the case where the first material does not contain the particles.

Example 3

A thermoelectric generator having a tube shape was produced, and its output electric power was evaluated. This Example differs from Example 2 in that, without forming the first compacts and second compacts, a sintered body is obtained in which first layers of the first material and second layers of the second material are alternately stacked.

First, similarly to Example 2, a mixture of nickel and silica (source material for the first material) was provided. The content amount of silica powder in the first material was 0.1 wt %.

Next, by a casting method, dense bodies of $Bi_{0.5}Sb_{1.5}Te_3$ having the shape shown in (a) to (d) of FIG. 5 (which hereinafter may be referred to as cup-shaped members) were formed. Thereafter, the rod 71, the die 72, and the jig 73L as shown in FIG. 8 were assembled, and a predetermined amount of source material for the first material was poured into the space between the rod 71 and the die 72. After a cup-shaped member was placed on the source material for the first material having been poured, a predetermined amount of source material for the first material was again poured. This process was repeated a predetermined number of times, and finally the jig 73U was placed on top.

Now, by spark plasma sintering, while applying a pressure, the stacked body in which the source material for the first material and the cup-shaped members were alternately stacked was heated. The temperature, pressure, and atmosphere during sinter were set as described in Example 2. Thus, a sintered body having a generally tubular shape was obtained. From this sintered body, the thermoelectric generation tube of Example 3-1 was produced, which had substantially the same shape as the thermoelectric generation tube of Example 2-1.

Moreover, in a manner similar to the thermoelectric generation tube of Example 3-1 except for changing the content amount of silica powder in the first material, thermoelectric generation tubes of Example 3-2, Example 3-3, Example 3-4, Example 3-5, Comparative Example 3-1, and Comparative Example 3-2 were produced. In the thermoelectric generation tubes of Example 3-2, Example 3-3, Example 3-4, Example 3-5, Comparative Example 3-1, and Comparative Example 3-2, the content amount of silica powder in the first material was 1 wt %, 2 wt %, 5 wt %, 10 wt %, 0 wt %, and 20 wt %, respectively.

Next, the output electric power of each thermoelectric generation tube was evaluated by a similar procedure to that of Example 2. The output electric powers of the thermoelectric generation tubes are shown in Table 3 below.

TABLE 3

|  | content amount of SiO$_2$ (silica powder) (wt %) | electric power (W) |
| --- | --- | --- |
| Comparative Example 3-1 | 0 | 0.9 |
| Example 3-1 | 0.1 | 1.7 |
| Example 3-2 | 1 | 2.2 |
| Example 3-3 | 2 | 2.5 |
| Example 3-4 | 5 | 2.4 |
| Example 3-5 | 10 | 1.2 |
| Comparative Example 3-2 | 20 | 0.5 |

Table 3 indicates that the thermoelectric generation characteristics of the thermoelectric generator are improved by forming the first layers from a first material containing a metal (which herein is nickel) and particles (which herein are silica) having a lower thermal conductivity than that of the metal, as compared to the case where the first material does not contain the particles. Table 3 also indicates that, by ensuring that the content amount of the particles in the first material is not less than 0.1 wt % and not more than 10 wt %, the resultant output electric power is increased by about three times at the maximum, as compared to the case where the first material does not contain the particles.

Example 4

A thermoelectric generator having a tube shape was produced, and its output electric power was evaluated. This Example differs from Example 2 in that the particle size of the particles having a lower thermal conductivity than that of the metal (which herein is silica) is changed.

First, by adopting similar materials and method of production to those of the thermoelectric generation tube of Example 2-4, the thermoelectric generation tube of Example 4-1 was produced. That is, the content amount of silica powder in the first material and the particle size were 5 wt % and 7 nm, respectively.

Next, in a manner similar to the thermoelectric generation tube of Example 4-1 except for changing the particle size of the silica powder in the first material, thermoelectric generation tubes of Example 4-2, Example 4-3, and Example 4-4 were produced. In the thermoelectric generation tubes of Example 4-2, Example 4-3, and Example 4-4, the particle size of the silica powder in the first material was, 100 nm, 1 µm and 10 µm, respectively. Moreover, as Comparative Example 4-1, a thermoelectric generation tube whose first material did not contain silica powder (a thermoelectric generation tube of a similar construction to that of the thermoelectric generation tube of Comparative Example 2-1) was produced.

Next, the output electric power of each thermoelectric generation tube was evaluated by a similar procedure to that of Example 2. The output electric powers of the thermoelectric generation tubes are shown in Table 4 below.

TABLE 4

|  | particle size of $SiO_2$ (silica powder) | electric power (W) |
| --- | --- | --- |
| Comparative Example 4-1 | (0) | 1.0 |
| Example 4-1 | 7 (nm) | 2.6 |
| Example 4-2 | 100 (nm) | 2.3 |
| Example 4-3 | 1 (µm) | 1.5 |
| Example 4-4 | 10 (µm) | 1.1 |

Table 4 indicates that the thermoelectric generation characteristics of the thermoelectric generator are improved by forming the first layers from a first material containing a metal (which herein is nickel) and particles (which herein are silica) having a lower thermal conductivity than that of the metal, as compared to the case where the first material does not contain the particles. Table 4 also indicates that the resultant electric power is increased whether the particle size of the particles in the first material is 7 nm, 100 nm, 1 µm, or 10 µm.

It was thus found that, in accordance with the thermoelectric generator of the present embodiment, in which particles having a lower thermal conductivity than that of a metal composing the first material is dispersed in the metal, thermoelectric generation characteristics of the thermoelectric generator are improved as compared to the case where the particles are not dispersed in the metal.

<Relationship Between Dispersion of Particles and Thermoelectric Generation Characteristics>

Now, the relationship between particle dispersion and the thermoelectric generation characteristics of the thermoelectric generator according to the embodiment will be described.

Figure 11:
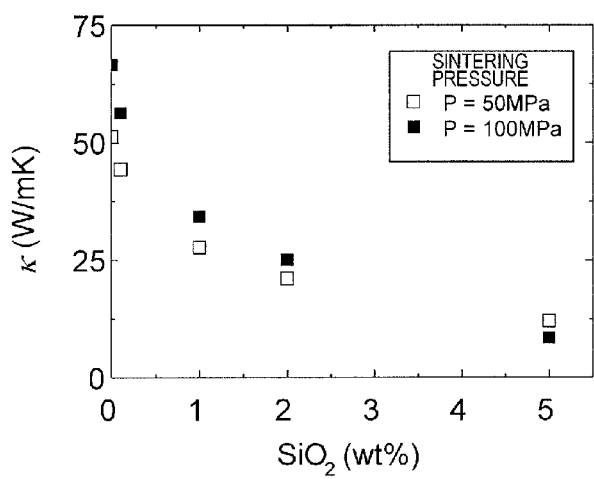
FIG. 11 is a graph showing a relationship between the content amount of particles in a first material and thermal conductivity of the first material.

FIG. 11 is a graph showing a relationship between the content amount of the particles in the first material and thermal conductivity of the first material. FIG. 11 shows exemplary measurement results of thermal conductivity in the case where silica particles are dispersed in nickel. Note that the measurement results in FIG. 11 are obtained when the content amount of silica powder in the first material are 0 wt %, 0.1 wt %, 1 wt %, 2 wt %, and 5 wt %. As shown in FIG. 11, regardless of whether the sintering pressure is 50 MPa or 100 MPa, the thermal conductivity κ is lowered with an increase in the content amount of the particles. Thus, by dispersing particles in the metal of the first material, thermal conductivity of the first material can be lowered. By lowering the thermal conductivity of the first material, a temperature increase in the one of the first principal face 24 and the second principal face 26 that is in contact with the low-temperature heat source is suppressed, whereby a greater electromotive force is obtained.

On the other hand, because of the particles being dispersed in the metal of the first material, the electrical resistivity ρ of the first material increases. As has been described with reference to FIG. 2, in the thermoelectric generator 10, the direction of temperature gradient (the Y axis direction) and the direction of the electric current (the Z axis direction) are orthogonal from a macroscopic point of view. Stated otherwise, when a load is connected to the thermoelectric generator 10 while a temperature difference exists between the first principal face 24 and the second principal face 26 of the thermoelectric generator 10, an electric current flows in a direction along the stacking direction. In other words, the electric current will pass through plural first layers made of the first material. Therefore, as the electrical resistivity of the first material increases, the internal resistance of the entire thermoelectric generator will increase, thus lowering the output electric power of the thermoelectric generator.

However, surprisingly, in a thermoelectric generator constructed so that the first layers and the second layers are alternately stacked while being inclined, its output electric power can actually increase by allowing particles to be dispersed in the metal of the first material (see Examples above).

Figure 12:
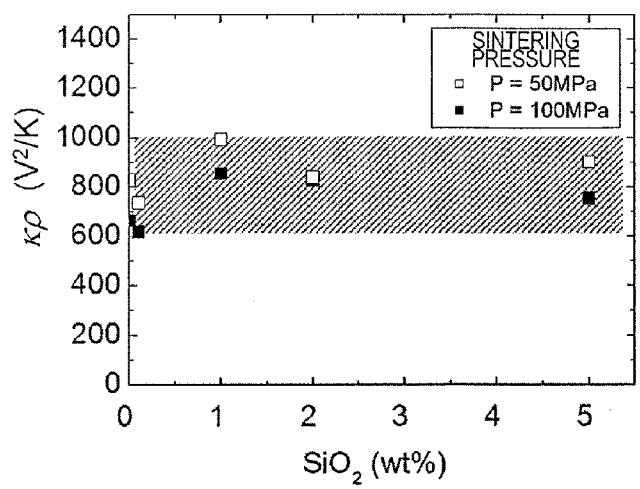
FIG. 12 is a graph showing a relationship between the content amount of silica particles and a product κ ρ of thermal conductivity κ and electrical resistivity ρ, with respect to a material obtained by dispersing silica particles in nickel.

Now, FIG. 12 is referred to. FIG. 12 is a graph showing a relationship between the content amount of silica particles and a product κ ρ of thermal conductivity κ and electrical resistivity ρ, with respect to a material obtained by dispersing silica particles (particle size: 7 nm) in nickel (particle size: not less than 3 µm and not more than 5 µm). FIG. 12 shows measurement results obtained when the content amount of silica powder was 0 wt %, 0.1 wt %, 1 wt %, 2 wt %, and 5 wt %. Note that the measurement results of FIG. 12 are of the case where the sintering temperature of the material obtained by dispersing silica particles in nickel is 500° C. In FIG. 12, white squares correspond to measurement results where the sintering pressure is 50 MPa, whereas black squares correspond to measurement results where the sintering pressure is 100 MPa. The hatched portion in FIG. 12 schematically shows a range of ±25% of the product κ ρ, in a material obtained by sintering nickel alone under the conditions of pressure=50 MPa, temperature=500° C.

As shown in FIG. 12, irrespective of whether the sintering pressure is 50 MPa or 100 MPa, the product κ ρ is within a ±25% range of that of the case where the first material does not contain particles. It can be seen from FIG. 12 that, even under an increased electrical resistivity, the output electric power can still increase so long as the change in the product κ ρ is substantially within a constant range. By ensuring that the change in the product κ ρ is within a ±25% range of that of the case where the first material does not contain particles, the output electric power can be increased to about 3 times of that of the case where the first material does not contain particles.

On the other hand, when the second material contains particles, the output electric power of the thermoelectric generator will decrease, unlike in the case where the first material contains particles. Specifically, in the case where the source material for the first material is nickel and the source material for the second material is $Bi_{0.5}Sb_{1.5}Te_3$, the thermal conductivity of the $Bi_{0.5}Sb_{1.5}Te_3$ layer decreases and the electrical resistivity increases as the content amount of silica particles increases. However, when looking at the thermal conductivity and electrical resistivity of the entire thermoelectric generator, the electrical resistivity increase is predominant. As a result, the output electric power of the thermoelectric generator decreases.

The above phenomenon is due to differences in physical property values between the first material and the second material. The first material has a higher thermal conductivity than does the second material. Therefore, the thermal conductivity of the first material predominates the thermal conductivity of the entire thermoelectric generator. Moreover, generally speaking, a substance with a high thermal conductivity tends to have a low electrical resistivity. Therefore, the electrical resistivity of the second material, whose thermal conductivity is lower than that of the first material, predominates the electrical resistivity of the entire thermoelectric generator. As a result, when the second material contains particles, the output electric power of the thermoelectric generator decreases, unlike in the case where the first material contains particles.

Thus, according to an embodiment of the present disclosure, a temperature difference between the first principal face and the second principal face can be effectively utilized, whereby thermal losses can be suppressed. As a result, the output electric power can be increased, whereby a practical thermoelectric generator utilizing a thermoelectric generation technique can be provided.

<Embodiment of Thermoelectric Generation Unit>

The aforementioned thermoelectric generator 10 may be used alone or in plurality. Electrically connecting a plurality of thermoelectric generators 10 makes it possible to retrieve a greater electric power.

Figure 13:
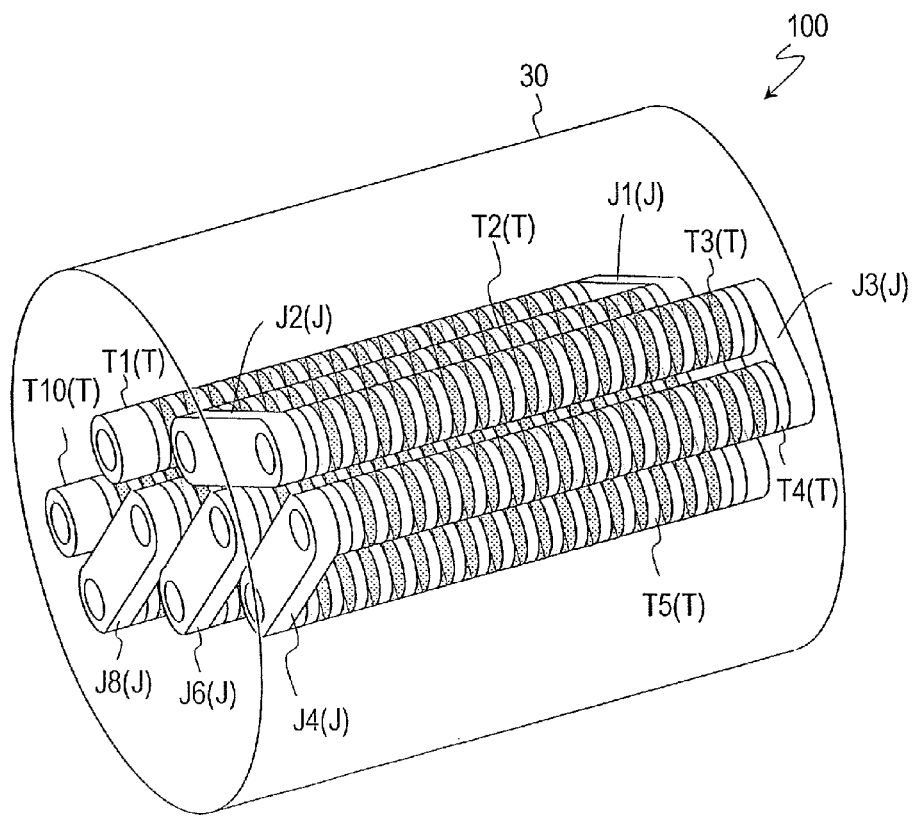
FIG. 13 is a perspective view showing a schematic construction of an illustrative thermoelectric generation unit 100 according to an embodiment of the present disclosure.

FIG. 13 is a perspective view showing a schematic construction of an illustrative thermoelectric generation unit 100 according to an embodiment of the present disclosure. The thermoelectric generation unit 100 shown in FIG. 13 includes a plurality of thermoelectric generation tubes, a container 30 which internally accommodates these thermoelectric generation tubes, and a plurality of electrically conductive members J which electrically connect the thermoelectric generation tubes. In the example of FIG. 13, ten thermoelectric generation tubes T1 to T10 are accommodated in the container 30. Typically, the ten thermoelectric generation tubes T1 to T10 are disposed substantially in parallel to one another, but such disposition is not the only implementation. The above-described thermoelectric generator having a tube shape (thermoelectric generation tube) T is used as each of the thermoelectric generation tubes T1 to T10.

The thermoelectric generation tubes T1 to T10 each have an outer peripheral surface and an inner peripheral surface, and an internal flow path which is defined by the inner peripheral surface. The thermoelectric generation tubes T1 to T10 are each constructed so as to generate an electromotive force in the respective axial direction because of a temperature difference between the inner peripheral surface and the outer peripheral surface. In other words, by introducing a temperature difference between the outer peripheral surface and the inner peripheral surface in each of the thermoelectric generation tubes T1 to T10, electric power is retrieved from the thermoelectric generation tubes T1 to T10. For example, by placing a high-temperature medium in contact with the internal flow path of each of the thermoelectric generation tubes T1 to T10 and a low-temperature medium in contact with the outer peripheral surface of each of the thermoelectric generation tubes T1 to T10, electric power can be retrieved from the thermoelectric generation tubes T1 to T10. Conversely, a low-temperature medium may be placed in contact with the inner peripheral surface of each of the thermoelectric generation tubes T1 to T10 and a high-temperature medium may be placed in contact with their outer peripheral surface. In the example shown in FIG. 13, the medium which comes in contact with the outer peripheral surface of the thermoelectric generation tubes T1 to T10 inside the container 30 and the medium which comes in contact with the inner peripheral surface of each thermoelectric generation tube T1 to T10 in the internal flow path of the respective thermoelectric generation tube are supplied through separate conduits (not shown), thus being isolated so as not to intermix.

Figure 14:
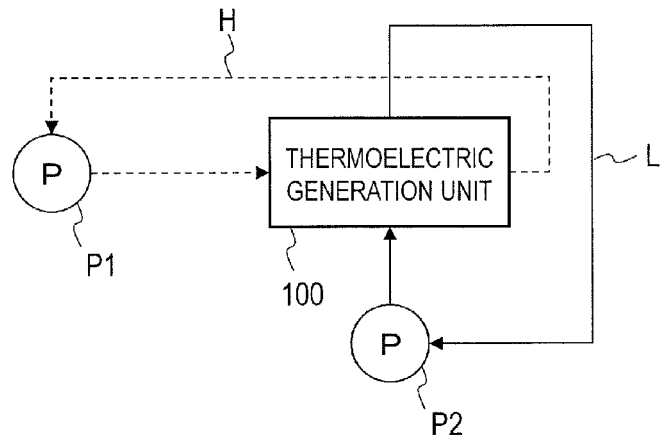
FIG. 14 is a block diagram showing an exemplary construction for introducing a temperature difference between the outer peripheral surface and the inner peripheral surface of the thermoelectric generation tube T.

FIG. 14 is a block diagram showing an exemplary construction for introducing a temperature difference between the outer peripheral surface and the inner peripheral surface of each thermoelectric generation tube T. In FIG. 14, arrows H in broken lines schematically represent a flow of the high-temperature medium, and arrows L in solid lines schematically represent a flow of the low-temperature medium. In the example shown in FIG. 14, the high-temperature medium and the low-temperature medium are circulated by pumps P1 and P2, respectively. For example, the high-temperature medium is supplied in the internal flow path of each thermoelectric generation tube T1 to T10, while the low-temperature medium is supplied inside the container 30. Although omitted from illustration in FIG. 14, heat to the high-temperature medium is supplied from a high-temperature heat source (e.g., a heat exchanger), and heat from the low-temperature medium is supplied to a low-temperature heat source. As the high-temperature heat source, steam, hot water, exhaust gas, or the like of relatively low temperature (e.g., 200° C. or less), which has conventionally been dumped unused into the ambient, can be used. It will be appreciated that a heat source of higher temperature may be used.

In the example shown in FIG. 14, the high-temperature medium and the low-temperature medium are illustrated as being circulated by the pumps P1 and P2, respectively; however, the thermoelectric generation system including the thermoelectric generation unit of the present disclosure is not limited to such an example. Both or one of the high-temperature medium and the low-temperature medium may be dumped into the ambient from the respective heat source(s), without constituting a circulating system. For example, high-temperature hot spring water that has sprung from the ground may be supplied to thermoelectric generation unit 100 as the high-temperature medium, and thereafter utilized for purposes other than power generation in the form of hot spring water which has cooled down, or dumped as it is. As the low-temperature medium, too, phreatic water, river water, or sea water may be drawn up to be supplied to the thermoelectric generation unit 100. After such is used as the low-temperature medium, it may be lowered to an appreciated temperature as necessary, and returned to the original water source, or dumped into the ambient.

FIG. 13 is referred to again. In the thermoelectric generation unit 100, a plurality of thermoelectric generation tubes T are electrically connected via the electrically conductive members J. In the example of FIG. 13, each adjacent pair consisting of two thermoelectric generation tubes T is interconnected by a respective electrically conductive member J. As a whole, the plurality of thermoelectric generation tubes T are connected in electrical series. For example, the two thermoelectric generation tubes T3 and T4 appearing foremost in FIG. 13 are interconnected by the electrically conductive member J3 at their right end. At their left end, these two thermoelectric generation tubes T3 and T4 are connected to other thermoelectric generation tubes T2 and T5, respectively, by the electrically conductive members J2 and J4.

Figure 15:
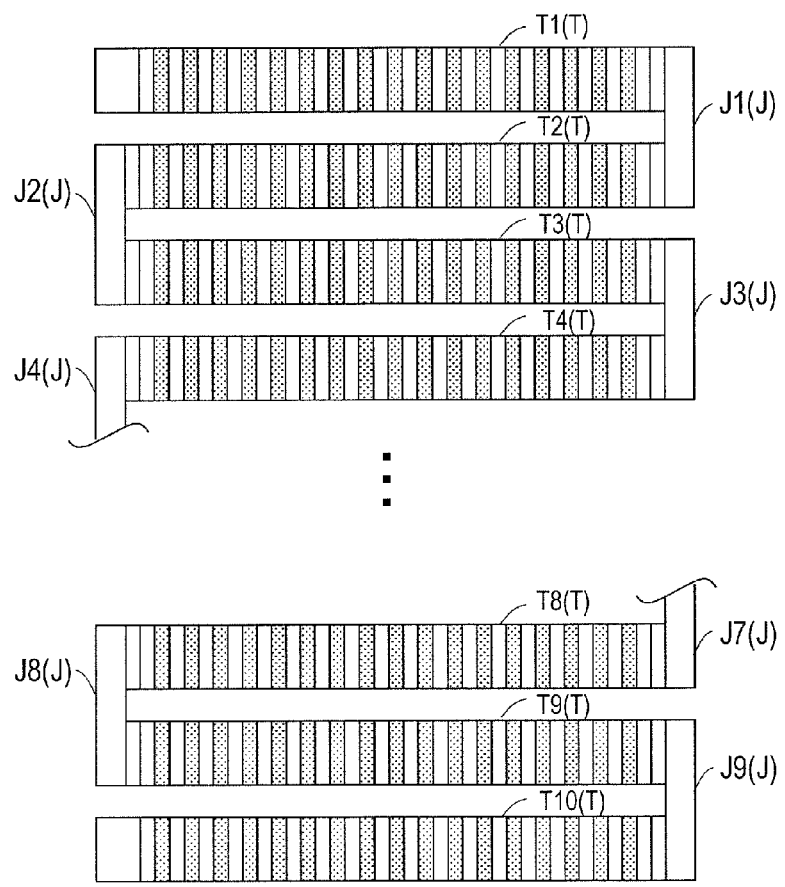
FIG. 15 is a diagram schematically showing an example of electrical connection of thermoelectric generation tubes T1 to T10.

FIG. 15 schematically shows an example of electrical connection of the thermoelectric generation tubes T1 to T10. As shown in FIG. 15, each of the electrically conductive members J1 to J9 electrically connects two thermoelectric generation tubes. The electrically conductive members J1 to J9 are arrayed so as to connect the thermoelectric generation tubes T1 to T10 in electrical series as a whole. In this example, the circuit that is constituted by the thermoelectric generation tubes T1 to T10 and the electrically conductive members J1 to J9 is traversable. This circuit may partially include thermoelectric generation tubes which are connected in parallel, and it is not essential that the circuit be traversable.

In the example of FIG. 15, an electric current flows from the thermoelectric generation tube T1 to the thermoelectric generation tube T10, for example. The electric current may flow from the thermoelectric generation tube T10 to the thermoelectric generation tube T1. The direction of this electric current is determined by the type of thermoelectric material used for the thermoelectric generation tubes T, the direction of heat flow occurring at the inner peripheral surface and the outer peripheral surface of the thermoelectric generation tube T, the direction of inclination of the planes of stacking in the thermoelectric generation tubes T, and so on. The connection of the thermoelectric generation tubes T1 to T10 is determined so that electromotive forces occurring in the respective thermoelectric generation tubes T1 to T10 do not cancel one another, but are superposed.

Note that the direction of the electric current flowing through the thermoelectric generation tubes T1 to T10 and the flow direction of the medium (high-temperature medium or the low-temperature medium) flowing through the internal flow paths of the thermoelectric generation tubes T1 to T10 are unrelated. For example, in the example of FIG. 15, the flow direction of the medium flowing through the internal flow paths of the thermoelectric generation tubes T1 to T10 may universally be from the left to the right in the figure, for example.

<One Implementation of Thermoelectric Generation Unit>

Figure 16A:
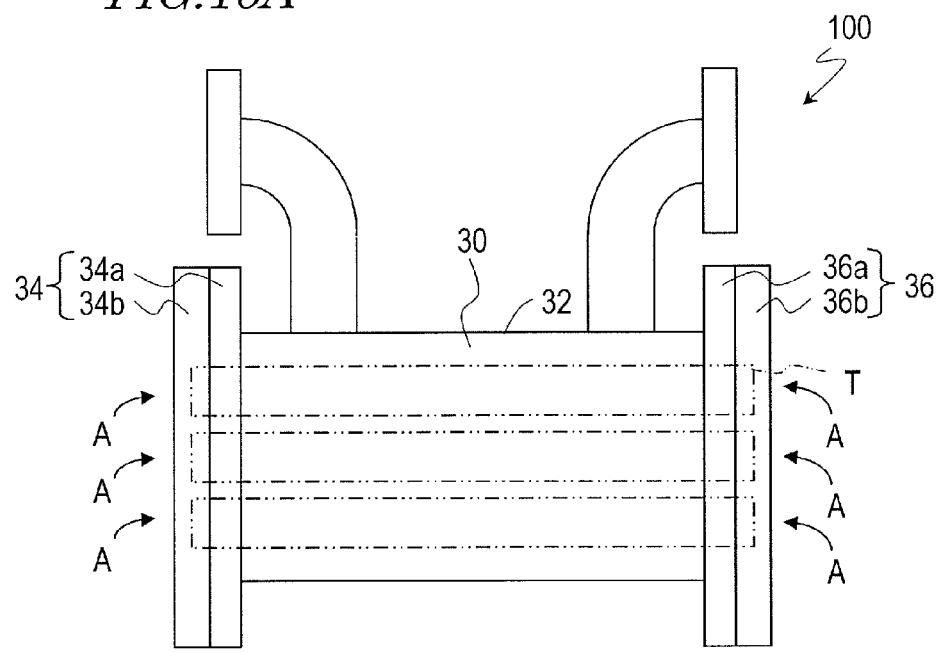
FIG. 16A is a front view showing one implementation of the thermoelectric generation unit.
Figure 16B:
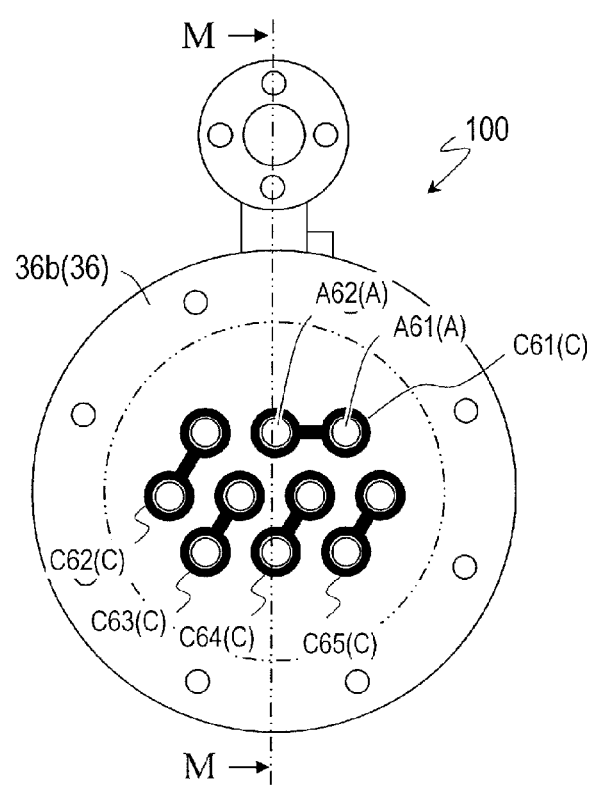
FIG. 16B is a diagram showing one of the side faces of the thermoelectric generation unit 100 (shown herein is a right side view).

Next, FIGS. 16A and 16B are referred to. FIG. 16A is a front view showing one implementation of the thermoelectric generation unit, and FIG. 16B is a diagram showing one of the side faces of the thermoelectric generation unit 100 (shown herein is a right side view). As shown in FIG. 16A, this implementation of the thermoelectric generation unit 100 includes a plurality of thermoelectric generation tubes T and a container 30 internally accommodating the plurality of thermoelectric generation tubes T.

As has been described with reference to FIG. 14, the high-temperature medium and the low-temperature medium are supplied to the thermoelectric generation unit 100. For example, through a plurality of openings A, a high-temperature medium is supplied in the internal flow path of each of the thermoelectric generation tubes T1 to T10. On the other hand, a low-temperature medium is supplied inside the container 30 via a fluid inlet 38a described later. As a result, a temperature difference is introduced between the outer peripheral surface and the inner peripheral surface of each thermoelectric generation tube T. At this time, in the thermoelectric generation unit 100, heat exchange occurs between the high-temperature medium and the low-temperature medium, and an electromotive force occurs in each of the thermoelectric generation tubes T1 to T10 in the respective axial direction.

The container 30 in the present embodiment includes a cylindrical shell 32 surrounding the thermoelectric generation tubes T, and a pair of plates 34 and 36 provided so as to close both open ends of the shell 32. In this example, the plate 34 is fixed on the left end of the shell 32, whereas the plate 36 is fixed on the right end of the shell 32. The plates 34 and 36 each have a plurality of openings A through which the thermoelectric generation tubes T are respectively inserted, such that both ends of each thermoelectric generation tube T are inserted into the corresponding pair of openings A in the plates 34 and 36.

In the example shown in FIG. 16A, the plate 34 includes a first plate portion 34a which is fixed on the shell 32, and a second plate portion 34b which is detachably mounted to the first plate portion 34a. Similarly, the plate 36 includes a first plate portion 36a which is fixed on the shell 32, and a second plate portion 36b which is detachably mounted to the first plate portion 36a. The openings A in the plates 34 and 36 penetrate through, respectively, the first plate portions 34a and 36a and the second plate portions 34b and 36b, thus leaving the flow paths of the thermoelectric generation tubes T open to the exterior of the container 30.

As shown in FIG. 16B, ten openings A are provided in the plate 36. Similarly, ten openings A are provided in the plate 34. In the example shown in FIGS. 16A and 16B, the openings A in the plate 34 and the openings A in the plate 36 are placed in mirror symmetric relationship, such that the ten lines connecting the center points of the corresponding pair of openings A are parallel to one another. With this construction, each thermoelectric generation tube T can be supported in parallel by the corresponding pair of openings A. In the container 30, the plurality of thermoelectric generation tubes T do not need to be in a parallel relationship, but may be in a "non-parallel" or "skew" relationship.

As shown in FIG. 16B, the plate 36 has channels (which hereinafter may be referred to as "connection grooves") C which are formed so as to interconnect at least two of the openings A in the plate 36. In the example shown in FIG. 16B, the channel C61 interconnects the opening A61 and the opening A62. Any other channel C62 to C65 similarly interconnects two of the openings A in the plate 36. An electrically conductive member is accommodated in each of the channels C61 to C65.

Each channel C is composed of a recess in the first plate portion and a recess in the second plate portion, for example. Alternatively, each channel C may be composed of a recess in either one of the first plate portion and the second plate portion. In the case where the container 30 is made of a metal, insulative coating may be provided on the inside of the channel C to prevent electrical conduction between the container 30 and any electrically conductive members (i.e., connection plates and terminal plates, which will be described later). For example, the plate 34 (34a and 34b) may include a main body made of a metal and an insulative coating at least partially covering the surface of the main body. Similarly, the plate 36

(36a and 36b) may include a main body made of a metal and an insulative coating at least partially covering the surface of the main body.

Typically, the electrically conductive members are made of a metal. Examples of materials composing the electrically conductive member include copper (oxygen-free copper), brass, aluminum, and the like. From the standpoint of corrosion prevention, nickel plating or tin plating may be provided. The electrically conductive members may include a main body of a metal and an insulative coating at least partially covering the surface of the main body. For example, insulative coating may be made of a resin such as TEFLON™. In the case where the main body of each electrically conductive member J is made of aluminum, an insulating oxide coating may be formed partially on the surface as an insulative coating.

Figure 17:
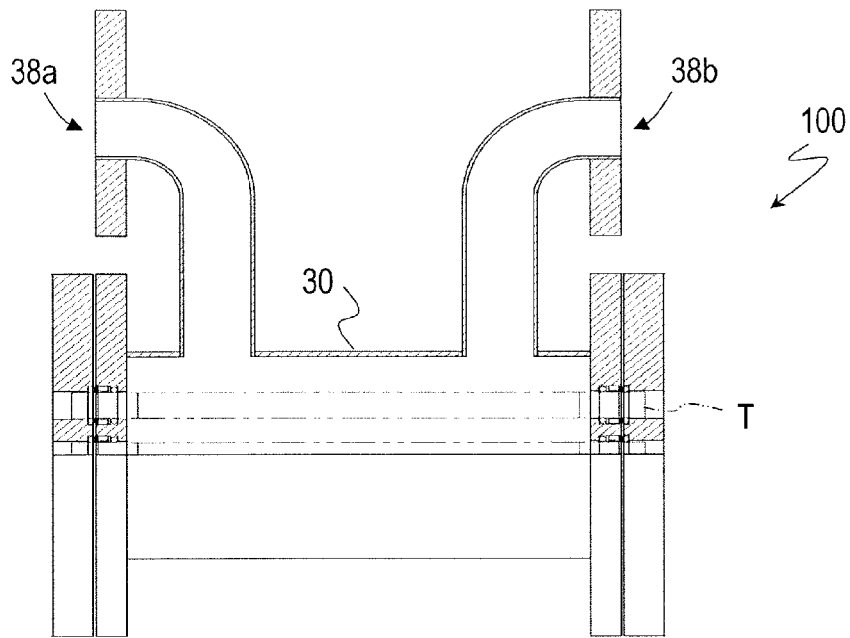
FIG. 17 is a diagram partially showing an M-M cross section in FIG. 16B.

FIG. 17 partially shows an M-M cross section in FIG. 16B. In FIG. 17, a lower half of the container 30 is not shown in cross section; rather, its front is shown. As shown in FIG. 17, the container 30 has the fluid inlet 38a and a fluid outlet 38b for allowing a fluid to flow inside. In the thermoelectric generation unit 100, the fluid inlet 38a and fluid outlet 38b are disposed in an upper portion of the container 30. The place of the fluid inlet 38a is not limited to the upper portion of the container 30, but may be the lower portion of the container 30, for example. The same is also true of the fluid outlet 38b. The fluid inlet 38a and the fluid outlet 38b do not need to be used fixedly as an inlet and an outlet of fluid; the inlet and outlet of fluid may be inverted on a regular or irregular basis. The flow direction of fluid does not need to be fixed. The numbers of the fluid inlet 38a and fluid outlet 38b do not need to be one each; both or one of the fluid inlet 38a and fluid outlet 38b may exist in plurality.

Figure 18:
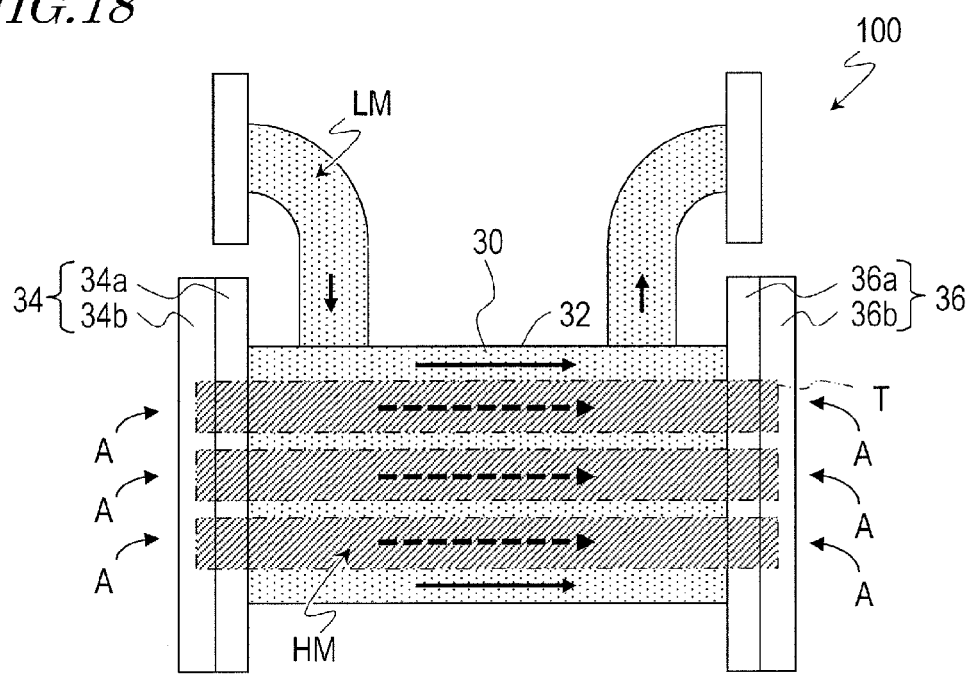
FIG. 18 is a diagram schematically showing an example of flow directions of a high-temperature medium and a low-temperature medium introduced in the thermoelectric generation unit 100.

FIG. 18 is a diagram schematically showing an example of flow directions of the high-temperature medium and the low-temperature medium introduced in the thermoelectric generation unit 100. In the example of FIG. 18, a high-temperature medium HM is supplied in the internal flow path of each of the thermoelectric generation tubes T1 to T10, whereas a low-temperature medium LM is supplied inside the container 30. In this example, via the openings A in the plate 34, the high-temperature medium HM is introduced in the internal flow path of each thermoelectric generation tube. The high-temperature medium HM introduced in the internal flow path of each thermoelectric generation tube comes in contact with the inner peripheral surface of the thermoelectric generation tube. On the other hand, the low-temperature medium LM is introduced inside the container 30 from the fluid inlet 38a. The low-temperature medium LM introduced inside the container 30 comes in contact with the outer peripheral surface of each thermoelectric generation tube.

In the example shown in FIG. 18, while flowing through the internal flow path of each thermoelectric generation tube, the high-temperature medium HM exchanges heat with the low-temperature medium LM. The high-temperature medium HM whose temperature has lowered through heat exchange with the low-temperature medium LM is discharged to the exterior of the thermoelectric generation unit 100 via the openings A in the plate 36. On the other hand, while flowing inside the container 30, the low-temperature medium LM exchanges heat with the high-temperature medium HM. The low-temperature medium LM whose temperature has increased through heat exchange with the high-temperature medium HM is discharged to the exterior of the thermoelectric generation unit 100 from the fluid outlet 38b. The flow direction of the high-temperature medium HM and the flow direction of the low-temperature medium LM shown in FIG. 18 are only an example. One or both of the high-temperature medium HM and the low-temperature medium LM may flow from the right to the left in the figure.

In one implementation, the high-temperature medium HM (e.g., hot water) may be introduced in the flow path of each thermoelectric generation tube T, and the low-temperature medium LM (e.g., cooling water) may be introduced from the fluid inlet 38a to fill the inside of the container 30. Conversely, the low-temperature medium LM (e.g., cooling water) may be introduced in the flow path of each thermoelectric generation tube T, and the high-temperature medium HM (e.g., hot water) may be introduced from the fluid inlet 38a to fill the inside of the container 30. Thus, a temperature difference which is necessary for power generation can be introduced between the outer peripheral surface 24 and the inner peripheral surface 26 of each thermoelectric generation tube T.

<Relationship Between the Direction of Heat Flow and the Direction of Inclination of Planes of Stacking>

Now, with reference to FIGS. 19A and 19B, the relationship between the direction of heat flow in each thermoelectric generation tube T and the direction of inclination of the planes of stacking in the thermoelectric generation tube T will be described.

Figure 19A:
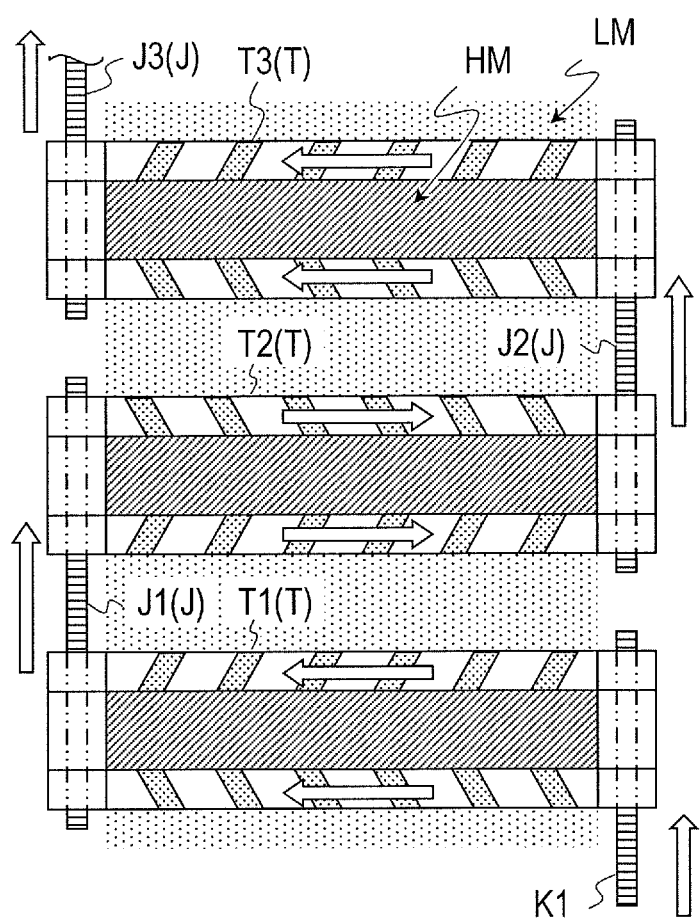
FIG. 19A is a diagram schematically showing directions of an electric current flowing in thermoelectric generation tubes T which are connected in electrical series.

FIG. 19A is a diagram schematically showing directions of an electric current flowing in thermoelectric generation tubes T which are connected in electrical series. FIG. 19A schematically shows cross sections of three (T1 to T3) of the thermoelectric generation tubes T1 to T10.

In FIG. 19A, an electrically conductive member K1 as a terminal plate described later is connected to one end of the thermoelectric generation tube T1 (e.g., the end at the first electrode side), whereas the electrically conductive member (connection plate) J1 is connected to the other end (e.g., the end at the second electrode side) of the thermoelectric generation tube T1. The electrically conductive member J1 is also connected to one end (i.e., the end at the first electrode side) of the thermoelectric generation tube T2, whereby the thermoelectric generation tube T1 and the thermoelectric generation tube T2 are electrically connected. Furthermore, the other end (i.e., the end of the second electrode) of the thermoelectric generation tube T2 and one end (i.e., the end at the first electrode side) of the thermoelectric generation tube T3 are electrically connected by the electrically conductive member J2.

In this case, as shown in FIG. 19A, the direction of inclination of the planes of stacking in the thermoelectric generation tube T1 is opposite to the direction of inclination of the planes of stacking in the thermoelectric generation tube T2. Similarly, the direction of inclination of the planes of stacking in the thermoelectric generation tube T2 is opposite to the direction of inclination of the planes of stacking in the thermoelectric generation tube T3. In other words, in the thermoelectric generation unit 100, between each thermoelectric generation tube T1 to T10 and the thermoelectric generation tube that is connected thereto via a connection plate, the direction of inclination of the planes of stacking is reversed.

Now, assume that the high-temperature medium HM is placed in contact with the inner peripheral surface of each of the thermoelectric generation tubes T1 to T3, and the low-temperature medium LM in contact with their outer peripheral surface, as shown in FIG. 19A. Then, in the thermoelectric generation tube T1, an electric current flows from the right to the left in the figure, for example. On the other hand, in the thermoelectric generation tube T2, in which the direction of inclination of the planes of stacking is opposite from that of the thermoelectric generation tube T1, an electric current flows from the left to the right in the figure.

Figure 19B:
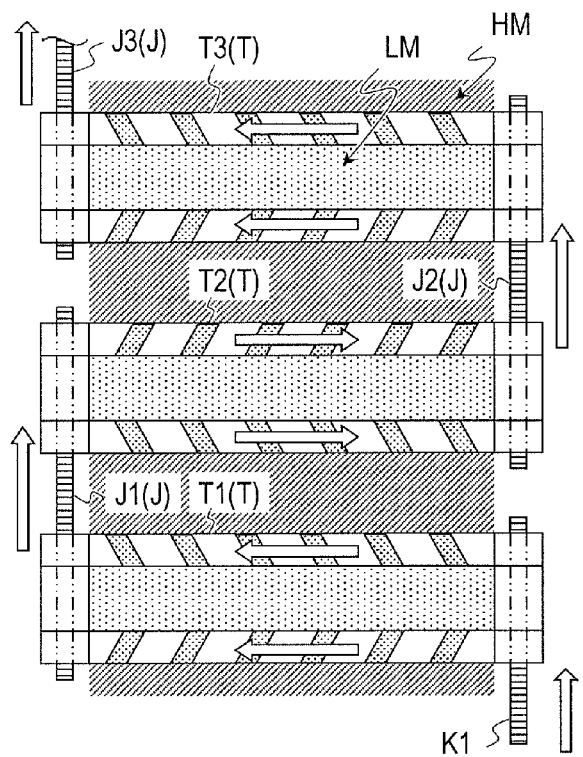
FIG. 19B is a diagram schematically showing directions of an electric current flowing in thermoelectric generation tubes T which are connected in electrical series.

Next, FIG. 19B is referred to. Similarly to FIG. 19A, FIG. 19B schematically shows directions of an electric current flowing in thermoelectric generation tubes T which are connected in electrical series. As in the example shown in FIG. 19A, FIG. 19B illustrates a case where the thermoelectric generation tubes T1 to T3 are consecutively connected so that the direction of inclination of the planes of stacking is alternately opposite. In this case, too, the direction of inclination of the planes of stacking is reversed between every two interconnected thermoelectric generation tubes, so that the electromotive forces occurring in the thermoelectric generation tubes T1 to T3 do not cancel one another, but are superposed.

If the low-temperature medium LM is placed in contact with the inner peripheral surface of each of the thermoelectric generation tubes T1 to T3 and the high-temperature medium HM in contact with their outer peripheral surface, as shown in FIG. 19B, the polarity of voltages occurring in the respective thermoelectric generation tubes T1 to T3 become opposite to those illustrated in FIG. 19A. In other words, when the direction of temperature gradient in each thermoelectric generation tube is inverted, the polarity of the electromotive force in each thermoelectric generation tube (which may also be said to be the direction of the electric current flowing through each thermoelectric generation tube) is inverted. Therefore, for example, in order to ensure that an electric current flows from the electrically conductive member K1 to the electrically conductive member J3 as in FIG. 19A, the first electrode side and the second electrode side of each of the thermoelectric generation tubes T1 to T3 are to be reversed from the state illustrated in FIG. 19A. Note that electric current directions illustrated in FIGS. 19A and 19B are mere examples. Depending on the first material composing the first layers 20 and the second material composing the second layers 22, the electric current directions may become opposite to the electric current directions shown in FIGS. 19A and 19B.

<Electrical Connection Structure for Retrieving Electric Power to the Exterior of the Thermoelectric Generation Unit 100>

FIG. 15 is referred to again. In the example shown in FIG. 15, ten thermoelectric generation tubes T1 to T10 are connected in electrical series by the electrically conductive members J1 to J9. The connection between two thermoelectric generation tubes T provided by each of the electrically conductive members J1 to J9 is as described above. Hereinafter, an example electrical connection structure for retrieving electric power to the exterior of the thermoelectric generation unit 100 from the two generation tubes T1 and T10 located at both ends of the series circuit will be described.

Figure 20:
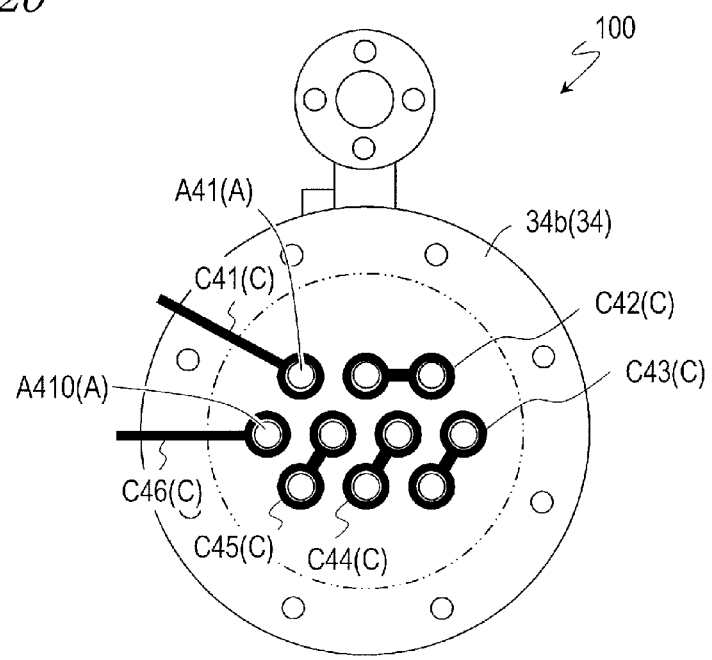
FIG. 20 is a diagram showing the other side face of the thermoelectric generation unit 100 shown in FIG. 16A (left side view).

FIG. 20 is referred to. FIG. 20 is a diagram showing the other side face of the thermoelectric generation unit 100 shown in FIG. 16A (left side view). While FIG. 16B shows construction around the plate 36, FIG. 20 shows construction around the plate 34. Constituents substantially similar to the constituents described with respect to the plate 36 are also provided for the plate 34. As described earlier, the openings A in the plate 34 and the openings A in the plate 36 are in mirror symmetric relationship. However, the grooves that connect each two openings A are not in mirror symmetric positions between the plate 34 and the plate 36. Description of any constituent or operation that has been described with respect to the plate 36 will not be repeated.

As shown in FIG. 20, the channels C42 to C45 interconnect at least two of the openings A provided in the plate 34. In the present specification, such channels may be referred to as "interconnections". The electrically conductive members accommodated in these interconnections have similar construction to that of the electrically conductive member J1. On the other hand, the channel C41 in the plate 34 extends from the opening A41 to the outer edge of the plate 34. In the present specification, a channel which extends from an opening in a plate to its outer edge may be referred to as a "terminal connection". The channels C41 and C46 shown in FIG. 20 are terminal connections. In each terminal connection, the electrically conductive member K1 functioning as a terminal for connecting to an external circuit is accommodated. One end of the electrically conductive member K1 protrudes to the exterior of the plate 34. Thus, the portion of the electrically conductive member K1 that protrudes to the exterior of the plate 34 functions as a terminal for connecting the thermoelectric generation unit to the external circuit. In the present specification, an electrically conductive member having a thermoelectric generation tube inserted to one end thereof, and the other end of which protrudes to the exterior, may be referred to as a "terminal plate".

Thus, in the thermoelectric generation unit 100, the thermoelectric generation tube T1 and the thermoelectric generation tube T10 are respectively connected to two terminal plates which are accommodated in the terminal connections. Moreover, the plurality of thermoelectric generation tubes T1 to T10 are connected in electrical series between the two terminal plates, via the connection plates accommodated in the channel interconnections. Therefore, via the two terminal plates whose one end protrudes to the exterior of plate 34 (36), the electric power which is generated by the plurality of thermoelectric generation tubes T1 to T10 can be retrieved to the exterior.

It is also possible to provide a plurality of thermoelectric generation units according to an embodiment of the present disclosure in series or parallel connection. Such a plurality of thermoelectric generation units may be connected electrically in series or electrically in parallel.

<Exemplary Construction of an Electric Circuit to be Connected to the Thermoelectric Generation Unit>

Next, with reference to FIG. 21, an exemplary construction of an electric circuit to be connected to the thermoelectric generation unit will be described.

Figure 21:
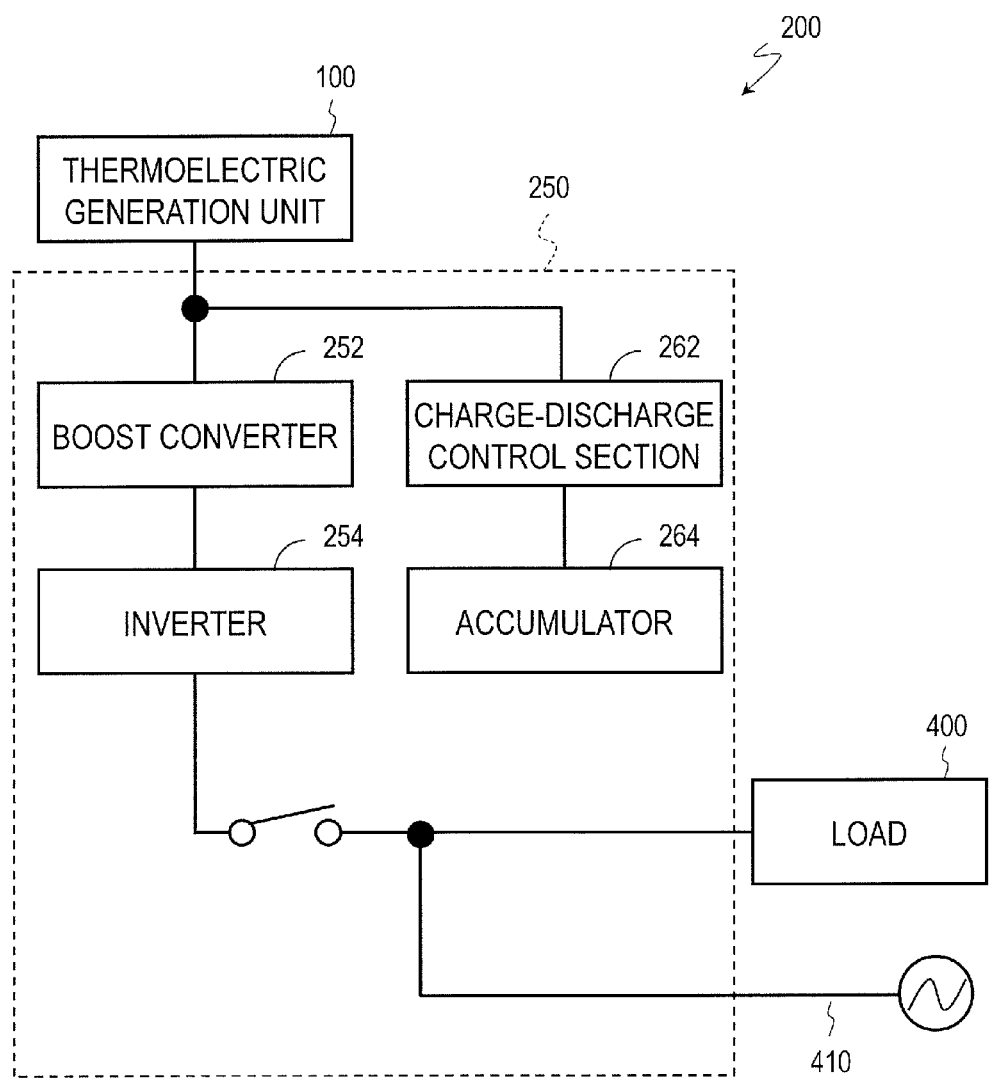
FIG. 21 is a block diagram showing an exemplary construction of an electric circuit included in a thermoelectric generation unit.

In the example of FIG. 21, a thermoelectric generation system 200 including the thermoelectric generation unit according to the present embodiment includes an electric circuit 250 which receives the electric power that is output from the thermoelectric generation unit 100. In other words, in one implementation, at least one of the plurality of electrically conductive members may have an electric circuit connected thereto, the electric circuit being electrically connected to the plurality of thermoelectric generation tubes.

The electric circuit 250 includes a boost converter 252 which boosts the voltage of the electric power that is output from the thermoelectric generation unit 100, and an inverter (DC-AC inverter) 254 which converts the DC power that is output from the boost converter 252 into AC power (whose frequency may be e.g. 50/60 Hz or any other frequency). The AC power which is output from the inverter 254 may be supplied to a load 400. The load 400 may be any of various electrical devices or electronic devices that operate by using AC power. The load 400 may in itself have a charging function, and does not need to be fixed on the electric circuit 250. Any AC power that has not been consumed by the load 400 may be connected to a commercial grid 410, thus to sell electricity.

The electric circuit 250 in the example of FIG. 21 includes a charge-discharge control section 262 and an accumulator 264 for storing the DC power that is obtained from the thermoelectric generation unit 100. The accumulator 264 may be a chemical battery such as a lithium ion secondary battery, or a capacitor such as an electric double-layer capacitor, for example. As necessary, the electric power which is stored in the accumulator 264 may be fed to the boost converter 252 by the charge-discharge control section 262, and, via the inverter 254, used or sold as AC power.

The level of electric power which is obtained from the thermoelectric generation unit 100 may fluctuate over time, either periodically or irregularly. For example, when the heat source for the high-temperature medium is waste heat from a factory, the temperature of the high-temperature medium may fluctuate depending on the operating schedule of the factory. In such a case, the state of power generation of the thermoelectric generation unit 100 may fluctuate, thus causing the voltage and/or electric current of the electric power obtained from the thermoelectric generation unit 100 to fluctuate in magnitude. Despite such fluctuations in the state of power generation, the thermoelectric generation system 200 shown in FIG. 21 can suppress the influence of fluctuations of power generation amount by storing electric power in the accumulator 264 via the charge-discharge control circuit 262.

In the case where electric power is to be consumed in real time along with the power generation, the boost ratio of the boost converter 252 may be adjusted according to the fluctuations in the state of power generation. Moreover, fluctuations in the state of power generation may be detected or predicted, and the flow rate, temperature, or the like of the high-temperature medium or low-temperature medium to be supplied to the thermoelectric generation unit 100 may be adjusted, thus achieving a control to maintain the state of power generation to be in a stationary state.

FIG. 14 is referred to again. In the exemplary system illustrated in FIG. 14, the flow rate of the high-temperature medium can be adjusted with a pump P1. Similarly, the flow rate of the low-temperature medium can be adjusted with a pump P2. By adjusting the flow rate of both or one of the high-temperature medium and the low-temperature medium, it is possible to control the power generation output from the thermoelectric generation tube.

It is also possible to control the temperature of the high-temperature medium by adjusting the amount of heat to be supplied to the high-temperature medium from a high-temperature heat source not shown. Similarly, it is also possible to control the temperature of the low-temperature medium by adjusting the amount of heat to be released from the low-temperature medium to a low-temperature heat source not shown.

Although not shown in FIG. 14, a valve and branches may be provided for at least one of the flow path of the high-temperature medium and the flow path of the low-temperature medium, thus adjusting the flow rate of the respective medium supplied to the thermoelectric generation system.

The thermoelectric generator according to the present disclosure can be used as an electric generator that utilizes the heat of effluent gas, etc., which is discharged from an automobile, a factory, or the like; or as a small-sized portable electric generator, for example.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A thermoelectric generator comprising:
    a first electrode and a second electrode opposing each other; and
    a stacked body having a first principal face and a second principal face and a first end face and a second end face, the first end face and the second end face being located between the first principal face and the second principal face, and the first electrode and the second electrode being respectively electrically connected to the first end face and the second end face;
    the stacked body being structured so that first layers made of a first material and second layers made of a second material are alternately stacked, the first material containing a metal and particles having a lower thermal conductivity than that of the metal, the particles being dispersed in the metal, and the second material having a higher Seebeck coefficient and a lower thermal conductivity than those of the first material;
    planes of stacking between the first layers and the second layers being inclined with respect to a direction in which the first electrode and the second electrode oppose each other, wherein
    a potential difference occurs between the first electrode and the second electrode due to a temperature difference between the first principal face and the second principal face.

2. The thermoelectric generator of claim 1, wherein the first principal face and the second principal face are planes, and the stacked body has a rectangular solid shape.

3. The thermoelectric generator of claim 1, wherein the stacked body has a tubular shape, and the first principal face and the second principal face are, respectively, an outer peripheral surface and an inner peripheral surface of the tube.

4. The thermoelectric generator of claim 1, wherein,
    the first material does not contain Bi but contains a metal different from Bi; and
    the second material contains Bi.

5. The thermoelectric generator of claim 1, wherein a content amount of the particles in the first material is not less than 0.1 wt % and not more than 10 wt %.

6. The thermoelectric generator of claim 5, wherein a content amount of the particles in the first material is not less than 1 wt % and not more than 5 wt %.

7. The thermoelectric generator of claim 1, wherein the particles are oxide particles.

8. The thermoelectric generator of claim 1, wherein the particles are particles of silicon dioxide.

9. The thermoelectric generator of claim 1, wherein the particles have a particle size of not less than 5 nm and not more than 100 nm.

10. The thermoelectric generator of claim 1, wherein the metal includes one or more selected from the group consisting of nickel, cobalt, silver, gold, copper, chromium, and aluminum.

11. The thermoelectric generator of claim 1, wherein the second material is $Bi_{0.5}Sb_{1.5}Te_3$.

12. A thermoelectric generation tube comprising the thermoelectric generator of claim 1,
    the stacked body having a tubular shape.

13. A thermoelectric generation unit comprising a plurality of thermoelectric generation tubes of claim 12,
    each of the plurality of thermoelectric generation tubes having an outer peripheral surface and an inner peripheral surface, and a flow path defined by the inner peripheral surface, such that a temperature difference between the inner peripheral surface and the outer peripheral surface causes an electromotive force to be generated along an axial direction of the thermoelectric generation tube, and the thermoelectric generation unit further comprising:

a container having the plurality of thermoelectric generation tubes accommodated in an interior thereof, the container having a fluid inlet and a fluid outlet for allowing a fluid to flow through the interior, the container having a plurality of openings in which the respective thermoelectric generation tubes are inserted; and a plurality of electrically conductive members electrically connecting the plurality of thermoelectric generation tubes.

14. The thermoelectric generator of claim 2, wherein the particles are oxide particles.

15. The thermoelectric generator of claim 3, wherein the particles are oxide particles.

16. The thermoelectric generator of claim 4, wherein the particles are oxide particles.

17. The thermoelectric generator of claim 5, wherein the particles are oxide particles.

18. The thermoelectric generator of claim 6, wherein the particles are oxide particles.

\* \* \* \* \*